(12) United States Patent
Walther et al.

(10) Patent No.: US 10,992,125 B2
(45) Date of Patent: Apr. 27, 2021

(54) PROTECTIVE DEVICE AND FIELDBUS MODULE COMPRISING A PROTECTIVE DEVICE

(71) Applicant: BECKHOFF AUTOMATION GMBH, Verl (DE)

(72) Inventors: Lars Walther, Leopoldshöhe (DE); Mikko Saukoski, Herford (DE)

(73) Assignee: Beckhoff Automation GmbH, Verl (DE)

( * ) Notice: Subject to any disclaimer, the term of this patent is extended or adjusted under 35 U.S.C. 154(b) by 234 days.

(21) Appl. No.: 16/200,562

(22) Filed: Nov. 26, 2018

(65) Prior Publication Data

US 2019/0165562 A1 May 30, 2019

(30) Foreign Application Priority Data

Nov. 27, 2017 (DE) ...................... 10 2017 128 008.1

(51) Int. Cl.
*H02H 3/087* (2006.01)
*H03K 17/687* (2006.01)
(Continued)

(52) U.S. Cl.
CPC ......... *H02H 3/087* (2013.01); *H01L 27/0248* (2013.01); *H01L 27/088* (2013.01);
(Continued)

(58) Field of Classification Search
CPC .......... H02H 3/08; H02H 3/081; H02H 3/087; H02H 3/20; H02H 3/202; H03K 17/6874;
(Continued)

(56) References Cited

U.S. PATENT DOCUMENTS

| 2005/0190515 A1* | 9/2005 | Hallak ................... H02H 3/087 361/90 |
| 2009/0105887 A1* | 4/2009 | El-Sayed ................ G05B 9/03 700/292 |

(Continued)

FOREIGN PATENT DOCUMENTS

| DE | 102006006878 A1 | 7/2007 |
| DE | 102008044411 A1 | 8/2009 |

(Continued)

OTHER PUBLICATIONS

"OptiMOS Power-Transistor," Infineon, Jan. 29, 2013 (10 pages).
"TPS249x Positive High-Voltage Power-Limiting Hot Swap Controller," Texas Instruments, Feb. 2017 (36 pages).

*Primary Examiner* — Alex Torres-Rivera
(74) *Attorney, Agent, or Firm* — Dorsey & Whitney LLP

(57) ABSTRACT

A protective device comprises an input, an output, a first power switch, a second power switch and a drive unit. The first and second power switches are electrically connected in parallel with one another between the input and the output. The first power switch is configured to conduct a first forward current in a conducting state and to limit said first forward current in a current-limiting state. The second power switch is configured to conduct a second forward current in a conducting state and to interrupt said second forward current in an interrupting state. The second power switch comprises a lower on resistance than the first power switch. The switch arrangement is configured, for limiting the current flowing between the input and the output, to interrupt the second forward current with the second power switch and to limit the first forward current with the first power switch.

16 Claims, 7 Drawing Sheets

(51) Int. Cl.
*H03K 17/082* (2006.01)
*H01L 27/088* (2006.01)
*H01L 29/06* (2006.01)
*H01L 27/02* (2006.01)
*H04L 29/12* (2006.01)
*H04L 12/403* (2006.01)
*H01L 29/78* (2006.01)

(52) U.S. Cl.
CPC ..... *H01L 29/0692* (2013.01); *H03K 17/0822* (2013.01); *H03K 17/6874* (2013.01); *H04L 61/2038* (2013.01); *H01L 29/7831* (2013.01); *H04L 12/403* (2013.01)

(58) Field of Classification Search
CPC .............. H03K 17/0822; H03K 17/122; H04L 12/403; H04L 61/2038; H01L 27/088; H01L 29/7831; H01L 29/0692; H01L 27/0248
See application file for complete search history.

(56) References Cited

U.S. PATENT DOCUMENTS

| | | | |
|---|---|---|---|
| 2012/0098517 A1* | 4/2012 | Esumi | H02H 3/08 323/311 |
| 2013/0286525 A1* | 10/2013 | Kanamori | H02H 9/004 361/101 |
| 2017/0279443 A1* | 9/2017 | Morimoto | H03K 17/693 |
| 2018/0167066 A1* | 6/2018 | Elliott | H02J 1/00 |

FOREIGN PATENT DOCUMENTS

| | | |
|---|---|---|
| DE | 102011120466 A1 | 6/2013 |
| DE | 102015121288 A1 | 6/2017 |

* cited by examiner

PROTECTIVE DEVICE AND FIELDBUS MODULE COMPRISING A PROTECTIVE DEVICE

CROSS-REFERENCE TO RELATED APPLICATION

This patent application claims priority of German patent application DE 10 2017 128 008.1, filed Nov. 27, 2017, entitled SCHUTZEINRICHTUNG UND FELDBUS-MODUL MIT EINER SCHUTZEINRICHTUNG, the disclosure and content of which are hereby incorporated by reference, in the entirety and for all purposes.

FIELD

The invention relates to a protective device and to a fieldbus module comprising a protective device.

BACKGROUND

Fieldbus systems comprising fieldbus modules are used in automation technology, inter alia, in order to control automation processes in installations comprising components arranged in a distributed fashion. Fieldbus systems generally comprise a fieldbus, via which a controller is connected to the fieldbus modules arranged in a distributed fashion. The fieldbus modules generally comprise inputs and/or outputs. The sensor arrangement is connected to the inputs of the fieldbus modules, and the actuator arrangement of the fieldbus system is connected to the outputs of the fieldbus modules. The sensor arrangement comprises for example all sensors that detect the state of the automation process to be controlled. The actuator arrangement comprises for example all actuators that may alter the state of the process to be controlled. Actuator arrangement and sensor arrangement are part of the field devices of the fieldbus system.

The fieldbus generally comprises a data transmission medium, for instance a network connection, via which data are transmitted between the controller and the fieldbus modules. For controlling the automation process, the fieldbus modules read in input signals from the sensor arrangement via their inputs, wherein the input signals represent the measurement values detected by the sensors. The fieldbus modules convert the input signals into input data, which are then transmitted via the fieldbus to the controller. The controller carries out a logic operation on the input data in order to generate output data for controlling the automation process by the actuator arrangement. The output data are transmitted via the fieldbus from the controller to the fieldbus modules and are converted into output signals by the fieldbus modules. The output signals are in turn output via the outputs of the fieldbus modules in order to drive the actuators.

An electrical supply energy required for the operation of the fieldbus modules or of the field devices connected to the fieldbus modules is generally provided by an energy supply device of the fieldbus system. The energy supply device is connected to the fieldbus modules generally via a supply line. In order to prevent the supply line, the energy supply device, the fieldbus modules or the field devices from being overloaded during the process of providing the supply energy, a protective device may be inserted into the supply line, which safeguards the supply line and the components connected to the supply line. The protective device is connected to the supply line generally between the energy supply device and the field devices to be safeguarded.

A protective device of this type is generally configured to monitor the supply line to which the supply energy is applied, for example by monitoring a voltage or a current flow on the supply line. The protective device generally comprises a power switch configured to interrupt the supply line and thus the forwarding of the supply energy to the field devices if a fault is ascertained during the monitoring of the supply line. The fault may be for example an in particular permanent, exceedance of a maximum permissible current or an exceedance of a maximum permissible voltage.

In addition, the power switch may be configured to limit the current intensity of the forwarded supply energy. The power switch may limit the current intensity in particular in the case of abrupt load changes at the output of the protective device, such as occur for example when capacitive or inductive loads are switched on or off.

The power switches used in the protective devices generally comprise a finite on resistance even in the on, that is to say closed, state, with the result that in the power switch electrical losses occur and heat loss is generated. The electrical losses are particularly high if high currents occur when the supply energy is forwarded via the supply line. This is the case particularly for the supply of actuators, for instance of electric motors.

In order that the protective device may effectively and reliably limit the current flow on the supply line, the power switch should be designed in such a way that it may take up and dissipate the power loss that arises during the limiting of the current flow. The power loss that arises may be greater by a multiple than the power loss that arises on account of the on resistance with the power switch permanently switched on. Therefore, the current limiting may generally be maintained only for a predefined maximum duration. If it is still necessary to limit the current flow after the maximum duration has elapsed in order to protect the field devices, the power switch must completely interrupt the current flow on the supply line.

In order to dissipate the heat that arises during the operation of the power switch, the power switch is generally provided with a heat sink, which may occupy a large amount of structural space at the housing of the protective device. In many protective devices the size of the heat sink determines the minimum size of the housing, with the result that it is difficult to arrange protective devices in compact housings.

The document DE 10 2011 120 466 A1 describes a protective device which is referred to as an electronic circuit breaker and which comprises a power switch for limiting the current flow in a current path to be monitored.

SUMMARY

The present invention provides an improved protective device and an improved fieldbus module comprising a protective device.

EXAMPLES

According to one aspect, a protective device comprises an input, an output, a first power switch, a second power switch and a drive unit. The first and second power switches are electrically connected in parallel with one another between the input and the output. The first power switch is configured to conduct a first forward current in a conducting state and to limit said first forward current in a current-limiting state. The second power switch is configured to conduct a second forward current in a conducting state and to interrupt said second forward current in an interrupting state. The second power switch comprises a lower on resistance than the first power switch. The switch arrangement is configured, for the purpose of limiting the current flowing between the input and the output, to interrupt the second forward current with the second power switch and to limit the first forward current with the first power switch.

According to another aspect, a fieldbus module comprises an interface unit for linking to a fieldbus, comprising an input for feeding with a supply energy, comprising an output for forwarding the supply energy to a further fieldbus module, and comprising a protective device. The protective device comprises a switch arrangement connected between the input and the output in order to limit the current of the supply energy flowing between the input and the output. The switch arrangement comprises a first power switch, a second power switch and a drive unit connected to the first and second power switches for controlling the power switches. The first and second power switches are electrically connected in parallel with one another between the input and the output, as a result of which a first part of the current flowing between the input and the output may flow as a first forward current through the first power switch and a second part of the current flowing between the input and the output may flow as a second forward current through the second power switch. The first power switch is configured to conduct the first forward current in a conducting state of the first power switch and to limit the first forward current in a current-limiting state of the first power switch. The second power switch is configured to conduct the second forward current in a conducting state of the second power switch and to interrupt the second forward current in an interrupting state of the second power switch. The second power switch in the conducting state of the second power switch comprises a lower on resistance than the first power switch in the conducting state of the first power switch. The switch arrangement is configured, for the purpose of limiting the current flowing between the input and the output, to interrupt the second forward current by the interrupting state of the second power switch and to limit the first forward current by the current-limiting state of the first power switch.

According to another aspect, the protective device comprises a first power switch, a second power switch and a drive unit. The first power switch comprises a first control connection and the second power switch comprises a second control connection. A first forward current is controllable by a control signal applicable to the first control connection of the first power switch. A second forward current is controllable by a control signal applicable to the second control connection of the second power switch. The first and second control connection, for the purpose of having a common control signal applied to them, are connected to a control output of the drive unit. The first power switch is configured to limit the first forward current in the current-limiting state of the first power switch if a common limiting signal is present as the common control signal at the first control connection of the first power switch. The second power switch is configured to interrupt the second forward current in the interrupting state of the second power switch if the common limiting signal is present at the second control connection of the second power switch.

BRIEF DESCRIPTION OF THE DRAWINGS

The invention is explained in greater detail below on the basis of preferred exemplary embodiments with reference to figures, in which.

DETAILED DESCRIPTION

Figure 1:
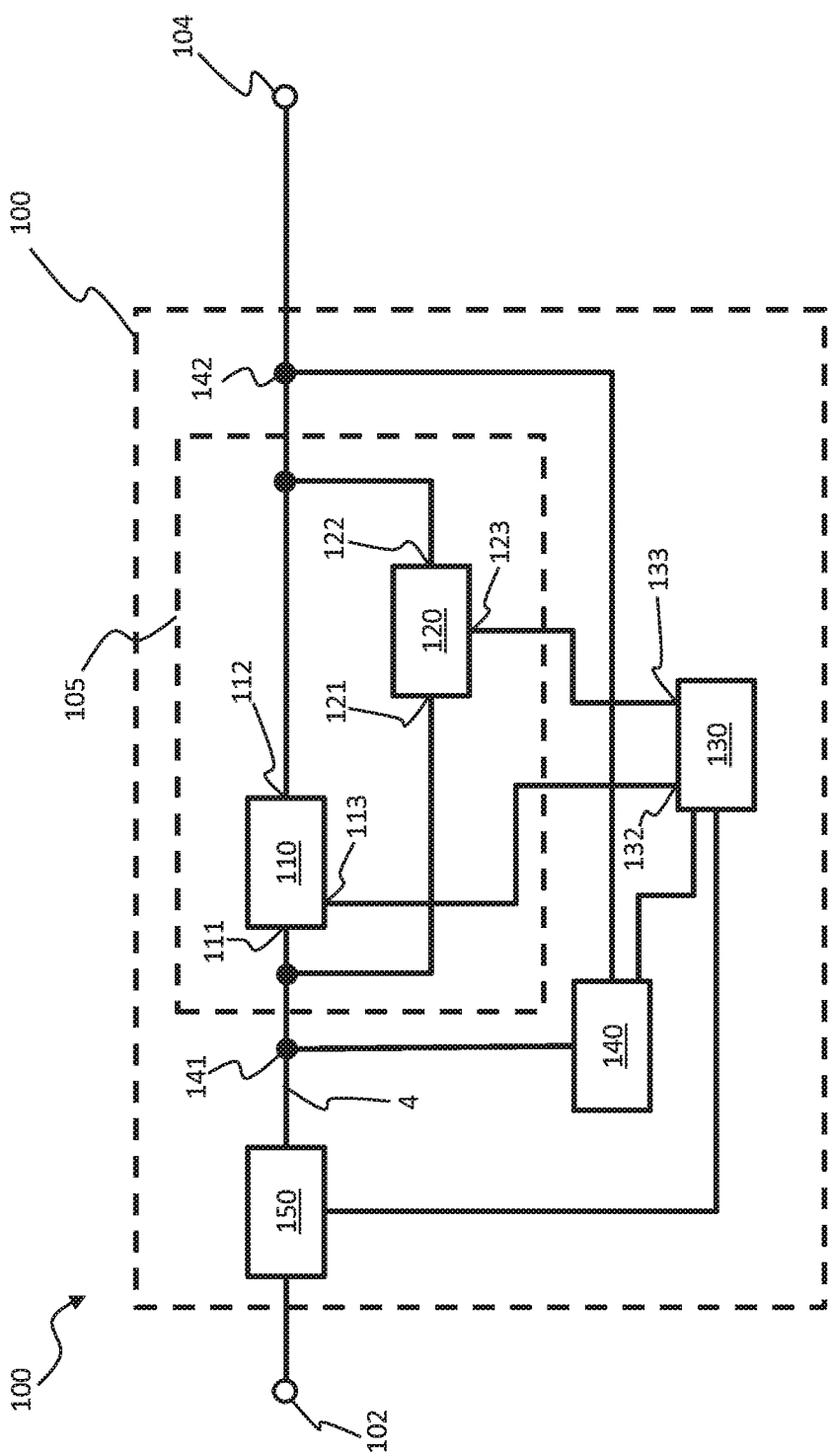
FIG. 1 shows a protective device.

A protective device comprises an input and an output, and comprises a switch arrangement connected between the input and the output in order to limit the current flowing between the input and the output. The switch arrangement comprises a first power switch, a second power switch and a drive unit connected to the first and second power switches for controlling the power switches, wherein the first and second power switches are electrically connected in parallel with one another between the input and the output. As a result a first part of the current flowing between the input and the output may flow as a first forward current through the first power switch and a second part of the current flowing between the input and the output may flow as a second forward current through the second power switch and the first power switch is configured to conduct the first forward current in a conducting state of the first power switch and to limit the first forward current in a current-limiting state of the first power switch and the second power switch is configured to conduct the second forward current in a conducting state of the second power switch and to interrupt the second forward current in an interrupting state of the second power switch. The second power switch in the conducting state of the second power switch comprises a lower on resistance than the first power switch in the conducting state of the first power switch. The switch arrangement is configured, for the purpose of limiting the current flowing between the input and the output, to interrupt the second forward current by the interrupting state of the second power switch and to limit the first forward current by the current-limiting state of the first power switch.

The on resistance denotes that resistance between the input connections and the output connections of the power switches which remains even when the power switch is conducting. Power switches configured in particular as semiconductor switches or transistors comprise an on resistance which may be in the region of a plurality of milliohms (mohm). Since the second power switch in the conducting state of the second power switch comprises a lower on resistance than the first power switch in the conducting state of the first power switch and the first and second power switches are electrically connected in parallel with one another between the input and the output of the protective device, the resulting on resistance between the input and the output of the protective device is substantially determined by the on resistance of the second power switch. The resulting on resistance between input and output of the protective device, provided that both the first power switch and the second power switch are in each case in the conducting state of the first and the second power switch, respectively, may thus maximally assume a value at the level of the on resistance of the second power switch. The first power switch used may be a power switch comprising a comparatively high on resistance, in particular comprising a higher on resistance than the second power switch, which would lead to high power losses in the switch arrangement without parallel connection of the second power switch. In the case of power switches configured as field effect transistors, the on resistance may also be referred to as $R_{DS(ON)}$ or as minimum volume resistance.

By virtue of the fact that, proceeding from an on state of the power switches, the second forward current flowing through the second power switch is completely interrupted by the second power switch being transferred to the interrupting state and the first power switch being transferred to the current-limiting state, only the first power switch is loaded during current-limiting operation of the switch arrangement. In particular, only the first power switch need be configured to take up a power loss that occurs during current-limiting operation of the switch arrangement. Overall, therefore, in the case of the switch arrangement comprising two parallel-connected power switches, the resulting on resistance of the switch arrangement and the maximum power loss able to be taken up by the switch arrangement in current-limiting operation may be defined independently of one another by suitable selection of the first and second power switches.

In one development of the protective device, the second power switch is configured to limit the second forward current in a current-limiting state of the second power switch. In this case, the first power switch is configured, in the current-limiting state of the first power switch, to take up more power loss than the second power switch in the current-limiting state of the second power switch. On account of the parallel connection of first and second power switches and the current limiting with the second power switch switched off solely by the first power switch, the second power switch, independently of the power loss able to be taken up by it, may be configured as a power switch comprising a low on resistance. In particular, the first power switch in the current-limiting state may take up more power than the second power switch in the conducting state.

In one development of the protective device, the drive unit is configured, for the purpose of limiting the current flowing between the input and the output, firstly to transfer the second power switch from the conducting state of the second power switch to the interrupting state of the second power switch and only afterward to transfer the first power switch from the conducting state of the first power switch to the current-limiting state of the first power switch. This makes it possible to avoid a situation in which the current flowing between the input and the output of the protective device, during the transition of the second power switch from the conducting state of the second power switch to the interrupting state of the second power switch, flows primarily via the second power switch and as a result a high power loss arises in the second power switch.

The protective device may thus be configured for example firstly to interrupt the second forward current through the second power switch and only afterward to limit the first forward current flowing through the first power switch.

In one development of the protective device, the first power switch and/or the second power switch are/is configured as a semiconductor switch, in particular as a transistor, in particular as a field effect transistor, in particular as a metal oxide semiconductor field effect transistor (MOSFET), in particular as an n-channel MOSFET. With power switches of this type, the first and/or the second forward current and thus the current flowing between the input and the output may be limited in a simple manner. Semiconductor switches generally comprise either a low on resistance or a high maximum power loss able to be taken up, but not both simultaneously. Given the parallel connection of first and second power switches, the first power switch may be a semiconductor switch configured for taking up a high maximum power loss in the current-limiting state, and the second power switch may be configured as a power switch, in particular as a semiconductor switch, in particular as a FET, comprising a low on resistance. An n-channel MOSFET generally comprises for example a lower on resistance than a p-channel MOSFET. The resulting on resistance of a switch arrangement may thereby be reduced if for example the first power switch and/or the second power switch are/is configured as an n-channel MOSFET.

In one development of the protective device, the first power switch comprises a first control connection and the second power switch comprises a second control connection. The first forward current is controllable by a control signal applicable to the first control connection of the first power switch and the second forward current is controllable by a control signal applicable to the second control connection of the second power switch. The first and second control connection, for the purpose of having a common control signal applied to them, are connected to a control output of the drive unit. The first power switch is configured to limit the first forward current in the current-limiting state of the first power switch if a limiting signal is present as the common control signal at the first control connection of the first power switch. The second power switch is moreover, configured to interrupt the second forward current in the interrupting state of the second power switch if the limiting signal is present at the second control connection of the second power switch.

Connecting the first control connection of the first power switch and the second control connection of the second power switch to a single control output of the drive unit enables the power switches to be driven in a simple manner with a common control signal. By virtue of the fact that the first power switch is configured to limit the first forward current when the limiting signal is present, and the second power switch is configured to interrupt the second forward current when the limiting signal is present, this ensures that only the first power switch contributes to a limiting of the current flowing between the input and the output of the protective device and has to take up the power loss that arises.

The control signal may be for example an analog voltage signal, an analog current signal or a digital signal. In particular, the control signal may be a control voltage, for instance a control voltage present at a control connection of the power switches, said control connection being configured as a gate connection, or a control current, for instance a control current present at a control connection of the power switches, said control connection being configured as a base connection. The limiting signal may be defined by a value of the control signal, for example by a voltage or current value, at which the first power switch limits the first forward current, that is to say is in the current-limiting state of the first power switch, and the second power switch interrupts the second forward current, that is to say is in the interrupting state of the second power switch.

By way of example, the first power switch may be configured to interrupt the first forward current if the control signal present at the first control connection falls below a first limit value and the second power switch may be configured to interrupt the second forward current if the control signal present at the second control connection falls below a second limit value lying above the first limit value. Alternatively, by way of example, the first power switch may be configured to interrupt the first forward current if the control signal present at the first control connection exceeds a first limit value and the second power switch may be configured to interrupt the second forward current if the control signal present at the second control connection exceeds a second limit value lying below the first limit value. The first and second limit values may be different.

The second power switch is then configured to interrupt the second forward current in the interrupting state of the second power switch if the control signal comprises a value between the first and second limit values. The first power switch is configured to limit the first forward current in the current-limiting state of the first power switch if the control signal present at the first control connection lies between the first limit value and a third limit value, wherein the third limit value lies between the first and second limit values. A control signal whose value or signal level lies between the first and third limit values then functions as limiting signal.

In one development of the protective device, the first and second power switches are configured to the effect that the control signal is applied as a control voltage to the first control connection of the first power switch and to the second control connection of the second power switch. The first power switch is configured to interrupt the first forward current in an interrupting state of the first power switch if the control voltage present at the first control connection of the first power switch falls below a first threshold voltage. The second power switch is configured to interrupt the second forward current if the control voltage present at the second control connection of the second power switch falls below a second threshold voltage. The second threshold voltage of the second power switch is greater than the first threshold voltage of the first power switch. The control voltage as the limiting signal comprises a voltage value lying between the first and second threshold voltages.

In a protective device of this type, the first and second power switches are controlled by a common voltage signal. This makes it possible for the current flowing between the input and the output of the switch arrangement to be controlled and limited rapidly and reliably with a single, common control signal. In this case, the first and second threshold voltages function as the first and second limit values. The third limit value is formed by a voltage value of the control voltage which must be exceeded for the first power switch to oppose the first forward current only with the on resistance. The third limit value then lies below the second limit value, in particular, and the limiting signal consists of all voltage values lying between the first and third limit values. In particular power switches configured as semiconductor switches, for instance as transistors, for instance as FET or MOSFET transistors, may be controlled by way of control voltages.

In one development of the protective device, the drive unit is configured to limit the current flowing between the input and the output of the protective device on the basis of an intensity of the current flow through the switch arrangement and/or on the basis of a voltage dropped across the switch arrangement in such a way that the first power switch is operated in a safe operating area of the first power switch. As a result, damage to the first power switch and the switch arrangement is avoided. The intensity of the current flow through the switch arrangement may be, in particular, the current intensity of the current flowing through the switch arrangement.

The safe operating area of the first power switch may also be referred to as the latter's SOA. The safe operating area may indicate the maximum power loss that may be taken up by the first power switch. The maximum power loss able to be taken up may be dependent on the current flow and/or the voltage drop between input connection and output connection of the first power switch. The maximum power loss able to be taken up may also be dependent on a time duration for which the power loss to be taken up arises in the first power switch. The safe operating area of the first power switch may be specified in each case depending on the time duration for which power is taken up and/or on the current flowing between the input connection and the output connection of the first power switch and/or on the voltage dropped between the input connection and the output connection of the first power switch, and/or on an ambient temperature.

The first power switch takes up power, in particular power loss, primarily in the current-limiting state, wherein the first power switch in the current-limiting state may act like a variable resistor. By virtue of the fact that the drive unit is configured to limit the current flowing between the input and the output of the protective device in such a way that the first power switch is operated in its safe operating area, overloading of and damage to the first power switch and the switch arrangement are prevented. By way of example, the drive unit may be configured to drive the first power switch and the second power switch in such a way that a predefined maximum power is taken up by the switch arrangement, in particular by the first power switch, only for a predefined duration and/or a predefined maximum current flows through the switch arrangement, in particular through the first power switch, only for a predefined duration. The drive unit may be configured to interrupt the first forward current through the first power switch, that is to say to transfer the first power switch to the interrupting state, as soon as the predefined duration is exceeded when taking up the maximum power and/or when the maximum current flows.

Like the first power switch, the second power switch may also comprise a safe operating area, which may differ from the safe operating area of the first power switch. Since, in the protective device, only the first power switch limits the current flowing between the input and the output of the protective device, the switch arrangement overall may be operated safely by only the safe operating area of the first power switch being monitored by the drive unit. In this respect, the drive unit may monitor the safe operating area of the switch arrangement in a simple manner.

In one development of the protective device, the drive unit is configured to end the limiting of the current flowing between the input and the output of the protective device by the drive unit firstly transferring the first power switch from the current-limiting state of the first power switch to the conducting state of the first power switch and only afterward transferring the second power switch from the interrupting state of the second power switch to the conducting state of the second power switch.

This makes it possible to ensure that only the first power switch, but not the second power switch, is operated in the current-limiting state. Moreover, the first power switch is already transferred to the conducting state of the first power switch, that is to say opposes the first forward current with a minimum resistance, before the second power switch is transferred to the conducting state of the second power switch. In this respect, when the second power switch is transferred to the conducting state, the second power switch is loaded to a lesser extent than would be the case in the event of the second power switch being transferred to the conducting state in conjunction with the interrupting or current-limiting state of the first power switch.

In one development of the protective device, the first power switch is configured to interrupt the first forward current in an interrupting state of the first power switch. The drive unit is configured to limit the current flowing between the input and the output of the protective device to a predefined maximum current with the first power switch that is in the current-limiting state of the first power switch and the second power switch that is in the interrupting state of the second power switch. The drive unit is configured to monitor a duration of the limiting of the current flowing between the input and the output of the protective device to the predefined maximum current, and to switch off the current flowing between the input and the output of the protective device with the first power switch that is in the interrupting state of the first power switch and the second power switch that is in the interrupting state of the second power switch after the current flowing between the input and the output of the protective device has been limited to the predefined maximum current for a predefined duration.

As a result, it is possible to avoid damage to the switch arrangement as a result of an exceedance of the maximum power loss able to be taken up by the switch arrangement, in particular by the first power switch. The drive unit may be configured for example to limit the current flowing between the input and the output of the protective device to a predefined maximum current with the power switches in the case of a load change at the output of the protective device. The predefined duration may be dimensioned for example in such a way that the first power switch is operated in its safe operating area.

A fieldbus module comprising an interface unit for linking to a fieldbus comprises an input for feeding with a supply energy, an output for forwarding the supply energy to a further fieldbus module, and a protective device. The protective device comprises a switch arrangement connected between the input and the output in order to limit the current flowing between the input and the output. The switch arrangement comprises a first power switch, a second power switch and a drive unit connected to the first and second power switches for controlling the power switches, wherein the first and second power switches are electrically connected in parallel with one another between the input and the output. As a result a first part of the current flowing between the input and the output may flow as a first forward current through the first power switch and a second part of the current flowing between the input and the output may flow as a second forward current through the second power switch. The first power switch is configured to conduct the first forward current in a conducting state of the first power switch and to limit the first forward current in a current-limiting state of the first power switch and the second power switch is configured to conduct the second forward current in a conducting state of the second power switch and to interrupt the second forward current in an interrupting state of the second power switch. The second power switch in the conducting state of the second power switch comprises a lower on resistance than the first power switch in the conducting state of the first power switch. The switch arrangement is configured, for the purpose of limiting the current flowing between the input and the output, to interrupt the second forward current by the interrupting state of the second power switch and to limit the first forward current by the current-limiting state of the first power switch.

In such a fieldbus module, the supply energy forwarded to the further fieldbus module is safeguarded by the protective device. As a result, it is possible to avoid an overloading in the case of a load change at the further fieldbus module or upon production or disconnection of the connection between the fieldbus modules with the supply voltage present (this case may also be referred to as "hot swap"). The current limiting by the first power switch may be used for example for limiting inrush currents (this case may also be referred to as "inrush current limiting") in the event of load changes at the output of the fieldbus module.

A parallel connection of first power switch and second power switch makes it possible to design the first power switch to take up high maximum power losses independently of its on resistance and to design the second power switch with a low on resistance independently of the maximum power loss able to be taken up. As a result, the protective device and thus also a module housing of the fieldbus module may be configured as particularly small and compact. In particular, the resulting on resistance of the switch arrangement and thus the energy loss that arises during operation with power switches permanently switched on in the fieldbus module may be kept particularly small.

In one development of the fieldbus module, the interface unit and the drive unit are connected to one another in order to transmit information relating to the limiting of the current of the supply energy via the fieldbus. This makes it possible for a controller connected to the fieldbus to monitor and/or to influence the protective device and in particular the limiting of the current of the supply energy by the protective device via the fieldbus. The information relating to the limiting of the current of the supply energy may be transmitted from the interface unit via the fieldbus, for example to the controller connected to the fieldbus, and/or may be transmitted via the fieldbus, for example from the controller, to the interface unit.

In one development of the fieldbus module, the first power switch is configured to interrupt the first forward current in an interrupting state of the first power switch. The drive unit is configured to limit the current flowing between the input and the output to a predefined maximum current with the first power switch that is in the current-limiting state of the first power switch and the second power switch that is in the interrupting state of the second power switch. The drive unit is configured to monitor a duration of the limiting of the current flowing between the input and the output to the predefined maximum current and to interrupt the current flowing via the output to the further fieldbus module with the first power switch that is in the interrupting state of the first power switch and the second power switch that is in the interrupting state of the second power switch after the current flowing between the input and the output has been limited to the predefined maximum current for a predefined duration.

This makes it possible to avoid an overloading of the first power switch by the power loss that arises during the limiting of the current flowing via the output of the fieldbus module to the further fieldbus module. The drive unit may be configured, in particular, to limit the current flowing via the output to the further fieldbus module to a predefined maximum current in the event of a load change at the output with the power switches.

In one development of the fieldbus module, the fieldbus module comprises a module housing comprising a side face. The side face of the module housing of the fieldbus module is arrangeable directly adjacent to a further side face of a module housing of the further fieldbus module. The output is arranged in an exposed fashion at the side face of the module housing in such a way that the output is electrically contactable by a supply input of the further fieldbus module, said supply input being arranged at the further side face of the further fieldbus module, by the further side face being arranged directly adjacent to the side face of the fieldbus module.

A fieldbus module of this type may be arranged and connected particularly simply in a fieldbus system comprising a plurality of fieldbus modules connected via the fieldbus. In particular, the fieldbus module and the further fieldbus module, for the purpose of forwarding the supply energy, may be electrically conductively connected to one another in a simple manner by their side faces being arranged next to one another and in a manner bearing against one another.

FIG. 1 shows a schematic illustration of a protective device 100. The protective device 100 comprises an input 102 and an output 104 connected to the input 102 via a supply line 4. Between the input 102 and the output 104, the protective device 100 comprises a switch arrangement 105 connected into the supply line 4. The switch arrangement 105 is configured to limit or conduct an electric current flowing between the input 102 and the output 104. Moreover, the switch arrangement 105 may be configured to interrupt the electric current flowing between the input 102 and the output 104.

The switch arrangement 105 comprises a first power switch 110 and a second power switch 120. The first power switch 110 and the second power switch 120 are electrically connected in parallel with one another between the input 102 and the output 104. A first input connection 111 of the first power switch 110 is electrically connected to a first input connection 121 of the second power switch 120, and a first output connection 112 of the first power switch 110 is electrically connected to a second output connection 122 of the second power switch 120.

The first output connection 112 and the second output connection 122 may, as illustrated, be connected directly to the output 104 of the protective device 100. Alternatively, the first output connection 112 and the second output connection 122 may also be connected to the output 104 via further electronic components. The first input connection 111 and the second input connection 121 are connected to the input 102 of the protective device 100 via a current measuring unit 150. Alternatively, the first input connection 111 and the second input connection 121 may also be connected to the input 102 directly or via other or further electronic components. The current measuring unit 150 may also be connected into the supply line 4 between the output connections 112, 122 of the power switches 110, 120 and the output 104.

The first power switch 110 is configured to control a first forward current flowing between the first input connection 111 and the first output connection 112 of the first power switch 110, in particular to interrupt the first forward current in an interrupting state of the first power switch 110 or to limit said first forward current in a current-limiting state of the first power switch 110 or to conduct said first forward current in a conducting state of the first power switch 110. In this case, the first power switch 110 may function as a variable resistor. In the interrupting state of the first power switch 110, the first power switch 110 opposes the first forward current with an off resistance of a magnitude such that the first forward current is completely interrupted apart from unavoidable leakage currents. In the current-limiting state of the first power switch 110, the first power switch 110 opposes the first forward current with a limiting resistance that is less than the off resistance. In the conducting state of the first power switch 110, the first power switch 110 opposes the first forward current with just a low on resistance. In particular, the on resistance is lower than the limiting resistance in the current-limiting state of the first power switch 110.

Analogously to the first power switch 110, the second power switch 120 may also be configured to control a second forward current flowing between the second input connection 121 and the second output connection 122 of the second power switch 120. In particular, the second power switch 20 may be configured to interrupt the second forward current in an interrupting state of the second power switch 120 or to limit said second forward current in a current-limiting state of the second power switch 120 or to conduct said second forward current in a conducting state of the second power switch 120. In this case, the second power switch 120 may function as a variable resistor. In the interrupting state of the second power switch 120, the second power switch 120 opposes the second forward current with an off resistance of a magnitude such that the second forward current is completely interrupted apart from unavoidable leakage currents. In the current-limiting state of the second power switch 120, the second power switch 120 opposes the second forward current with a limiting resistance that is less than the off resistance. In the conducting state of the second power switch 120, the second power switch 120 opposes the second forward current with just a low on resistance. In particular, the on resistance is lower than the limiting resistance in the current-limiting state of the second power switch 120.

However, the second power switch 120 may also be configured only either to interrupt the second forward current through the second power switch 120 in the interrupting state of the second power switch 120 or to conduct said second forward current in the conducting state of the second power switch 120, without being able additionally also to limit said second forward current. This may be the case for example for a second power switch 120 configured as a binary switch.

The first power switch 110 and/or the second power switch 120 may be configured as a semiconductor switch, in particular as a transistor, in particular as a field effect transistor, in particular as a metal oxide semiconductor field effect transistor (MOSFET). In particular, the first power switch 110 may be configured as a planar type FET and the second power switch 120 may be configured as a MOSFET.

If the first power switch 110 is configured as a FET or MOSFET, the first input connection 111 of the first power switch 110 may be configured as a source connection and the first output connection 112 of the first power switch 110 may be configured as a drain connection. If the second power switch 120 is configured as a FET or MOSFET, the second input connection 121 of the second power switch 120 may be configured as a source connection and the second output connection 122 of the second power switch 120 may be configured as a drain connection. In particular, the first input connection 111 of the first power switch 110 and the second input connection 121 of the second power switch 120 may be configured in each case as a source connection and the first output connection 112 of the first power switch 110 and the second output connection 122 of the second power switch 120 may be configured in each case as a drain connection. Alternatively, the first input connection 111 of the first power switch 110 may also be configured as a drain connection, and the first output connection 112 of the first power switch 110 as a source connection. Alternatively or additionally, the second input connection 121 of the second power switch 120 may be configured as a drain connection, and the second output connection 122 of the second power switch 120 as a source connection.

The current measuring unit 150 is configured to measure the current flowing between the input 102 and the output 104 on the supply line 4 and to generate a current measurement signal representing the measured current. The current measuring unit 150 may comprise a measuring resistor and the current measurement signal may be a voltage dropped across the measuring resistor. However, the current measuring unit 150 may also comprise a current converter and the current measurement signal may be a signal generated by the current converter, for example a current generated by the current converter. It is likewise conceivable for the current measuring unit 150 to be implemented individually for each power switch 110, 120. In this conceivable case, the first forward current flowing through the first power switch 110 and the second forward current flowing through the second power switch 120 would be measured in each case separately by the current measuring unit 150.

The switch arrangement 105 comprises a drive unit 130, which is connected to the power switches 110, 120 and is configured to control the power switches 110, 120. The drive unit 130 may, as illustrated in FIG. 1, be connected to the first control connection 113 of the first power switch 110 and to a second control connection 123 of the second power switch 120. The first power switch 110 is configured to control the first forward current on the basis of a first control signal present at the first control connection 113 of the first power switch 110. The second power switch 120 is configured to control the second forward current on the basis of a second control signal present at the second control connection 123 of the second power switch 120.

If the first power switch 110 and/or the second power switch 120 are/is FETs or MOSFETs, the first control connection 113 of the first power switch 110 and/or the second control connection 123 of the second power switch 120 may be configured as a gate connection of the relevant power switch 110, 120. The first control signal may then be a first gate-source voltage ($V_{GS}$) of the first power switch 110 dropped between the gate connection and the source connection of the first power switch 110. The second control signal may then be a second gate-source voltage ($V_{GS}$) of the second power switch 120 dropped between the gate connection and the source connection of the second power switch 120.

The second power switch 120 comprises a lower on resistance than the first power switch 110. By way of example, the on resistance of the second power switch 120 may be less than half, less than one third or less than one quarter of the on resistance of the first power switch 110. The second power switch 120 may comprise for example a maximum on resistance of less than 5 mohm, of less than 2.5 mohm or of less than 2 mohm. In particular, the second power switch 120 may comprise a maximum on resistance of less than 1.45 mohm. The first power switch 110 may comprise for example a maximum on resistance of less than 20 mohm, of less than 10 mohm or of less than 7 mohm. In particular, the first power switch 110 may comprise a maximum on resistance of less than 6.6 mohm.

In the case of semiconductor switches, in particular in the case of FETs or MOSFETs, the on resistance denotes that resistance with which the transistor opposes the current flowing between the source connection and the drain connection in the conducting state, i.e. in the on state. The on resistance may also be referred to as minimum volume resistance and abbreviated to $R_{DS(ON)}$.

In so far as the terms gate, source or drain are used in association with the first power switch 110 and the second power switch 120, the terminology is used for power switches 110, 120 configured as FETs or as MOSFETs. The terminology of the connections of other semiconductor switches is known to the person skilled in the art and the person skilled in the art may transfer the FET- or MOSFET-specific terms in a functionally conforming manner if the first power switch 110 or the second power switch 120 is not configured as a FET or MOSFET. In this regard, in the case of a bipolar transistor, for example, a gate connection corresponds to a base connection, a source connection corresponds to a collector connection, and a drain connection corresponds to an emitter connection. In particular, the first power switch 110 and/or the second power switch 120 may also be configured as a bipolar transistor.

The first power switch 110 is configured to limit the first forward current in the current-limiting state of the first power switch 110 if a first limiting signal is present as first control signal at the first control connection 113 of the first power switch 110. The first power switch 110 is configured to interrupt the first forward current in the interrupting state of the first power switch 110 if a first interrupting signal is present at the first control connection 113 of the first power switch 110. The first power switch 110 is configured to conduct the first forward current in the conducting state of the first power switch 110 if a first conducting signal is present at the first control connection 113 of the first power switch 110.

The second power switch 120 is configured to interrupt the second forward current in the interrupting state of the second power switch 120 if a second interrupting signal is present at the second control connection 123 of the second power switch 120. The second power switch 120 is configured to conduct the second forward current in the conducting state of the second power switch 120 if a second conducting signal is present at the second control connection 123 of the second power switch 120. The second power switch 120 may moreover be configured to limit the second forward current in the current-limiting state of the second power switch 120 if a second limiting signal is present at the second control connection 123 of the second power switch 120.

The first limiting signal may be a first control signal whose value lies in a first value range, wherein the first value range comprises all values between a first upper limit value and a first lower limit value lying below the first upper limit value. The first conducting signal may be a first control signal comprising a value lying above the first upper limit value, and the first interrupting signal may be a first control signal whose value lies below the first lower limit value. Alternatively, the first conducting signal may also be a first control signal comprising a value lying below the first lower limit value, and the first interrupting signal may be a first control signal whose value lies above the first upper limit value.

The second limiting signal may be a second control signal whose value lies in a second value range, wherein the second value range comprises all values between a second upper limit value and a second lower limit value lying below the second upper limit value. The second conducting signal may be a second control signal comprising a value lying above the second upper limit value, and the second interrupting signal may be a second control signal whose value lies below the second lower limit value. Alternatively, the second conducting signal may also be a second control signal comprising a value lying below the second lower limit value, and the second interrupting signal may be a second control signal whose value lies above the second upper limit value. If the second power switch 120 does not comprise a current-limiting state, then the first upper limit value and the first lower limit value may also be identical and the second value range may be omitted.

The switch arrangement 105 may be configured to the effect that the first control signal is applied as a first control voltage to the first control connection 113 of the first power switch 110. Furthermore, the first power switch 110 may be configured to control the first forward current depending on the first control voltage. The first control voltage may be given by the voltage drop between the first control connection 113 and the first input connection 111 or the first output connection 112 of the first power switch 110. The first control voltage may be applied as a gate voltage to the first power switch 110. By way of example, the first control voltage may be the voltage that is dropped between the first control connection 113 configured as gate connection and the source connection of the first power switch 110, for example the first input connection 111 of the first power switch 110.

The switch arrangement 105 may be configured to the effect that the second control signal is applied as a second control voltage to the second control connection 123 of the second power switch 120. Furthermore, the second power switch 120 may be configured to control the second forward current depending on the second control voltage. The second control voltage may be given by the voltage drop between the second control connection 123 and the second input connection 121 or the second output connection 122 of the second power switch 120. The second control voltage may be applied as a gate voltage to the second power switch 120. By way of example, the second control voltage may be the voltage that is dropped between the second control connection 123 configured as gate connection and the source connection of the second power switch 120, for example the second input connection 121 of the second power switch 120.

The first lower limit value may correspond to a first threshold voltage of the first power switch 110. The first power switch 110 is configured to assume the interrupting or blocking state and to interrupt the first forward current if the first control voltage falls below the first threshold voltage. The first interrupting signal is thus a first control voltage whose value is less than the first threshold voltage.

The first upper limit value corresponds to a first control voltage, for example a first gate-source voltage ($V_{GS}$), above which the first power switch 110 opposes the first forward current only with the on resistance}) of the first power switch 110. In this case, in particular, the first upper limit value may be dependent on the voltage dropped between the first input connection 111 and the first output connection 112 of the first power switch 110, for example on the drain-source voltage ($V_{DS}$). In this respect, the first upper limit value may be variable.

The first power switch 110 may be configured to assume the conducting state if the first control voltage lies above the first limit voltage. The first conducting signal is thus a first control voltage whose value is greater than the first limit voltage. The first power switch 110 may be configured to assume the current-limiting state if the first control voltage lies above the first threshold voltage of the first power switch 110 and below the first limit voltage of the first power switch 110. The first limiting signal is thus a first control voltage whose value is greater than the first threshold voltage and less than the first limit voltage.

The second lower limit value corresponds to a second threshold voltage of the second power switch 120. The second power stitch 120 is configured to assume the interrupting or blocking state and to interrupt the second forward current if the second control voltage falls below the second threshold voltage. The second interrupting signal is thus a second control voltage whose value is less than the second threshold voltage.

The second upper limit value corresponds to a second control voltage, for example a second gate-source voltage ($V_{GS}$), above which the second power switch 120 opposes the second forward current only with the on resistance}) of the second power switch 120. In this case, in particular, the second upper limit value may be dependent on the voltage dropped between the second input connection 121 and the second output connection 122 of the second power switch 120, for example on the drain-source voltage ($V_{DS}$). In this respect, the second upper limit value may be variable.

The second power switch 120 may be configured to assume the conducting state if the second control voltage lies above the second limit voltage. The second conducting signal is thus a second control voltage whose value is greater than the second limit voltage. The second power switch 120 may be configured to assume the current-limiting state if the second control voltage lies above the second threshold voltage of the second power switch 120 and below the second limit voltage of the second power switch 120. The second limiting signal is thus a second control voltage whose value is greater than the second threshold voltage and less than the second limit voltage.

If the first power switch 110 is configured as a FET or MOSFET, then the first power switch 110 is in the conducting state of the first power switch 110 if the first power switch 110 opposes the first forward current only with the on resistance of the first power switch 110. The values of the control signal at which the first power switch 110 is in the current-limiting state may be dependent on the voltage dropped between the first input connection 111 and the first output connection 112 of the first power switch 110, for example on the drain-source voltage ($V_{DS}$) of the first power switch 110.

If the second power switch 120 is configured as a FET or MOSFET, then the second power switch 120 is in the conducting state of the second power switch 120 if the second power switch 120 opposes the second forward current only with the on resistance of the second power switch 120. The values of the control signal at which the second power switch 120 is in the current-limiting state may be dependent on the voltage dropped between the second input connection 121 and the second output connection 122 of the second power switch 120, for example on the drain-source voltage ($V_{DS}$) of the second power switch 120.

If the first power switch 110 is configured as a FET or MOSFET, the first power switch 110 is in the interrupting state of the first power switch 110 if the first power switch 110 is operated in the off-state region of the first power switch 110 in accordance with a first output characteristic curve set of the first power switch 110. If the second power switch 120 is configured as a FET or MOSFET, the second power switch 120 may be in the interrupting state of the second power switch 120 if the second power switch 120 is operated in the off-state region of the second power switch 120 in accordance with a second output characteristic curve set of the second power switch 120.

In an output characteristic curve set of a FET or MOSFET, the forward current through the power switch is plotted as a function of the drain-source voltage $V_{DS}$ for various values of the gate-source voltage $V_{GS}$. In particular, in the first output characteristic curve set of the first power switch 110 configured as a FET or MOSFET, the first forward current through the first power switch 110 is plotted as a function of the drain-source voltage $V_{DS}$ of the first power switch 110 dropped between the drain connection and the source connection of the first power switch 110 for various values of the first gate-source voltage $V_{GS}$ of the first power switch 110 dropped between the gate connection and the source connection of the first power switch 110. In particular, in the second output characteristic curve set of the second power switch 120 configured as a FET or MOSFET, the second forward current through the second power switch 120 is plotted as a function of the drain-source voltage $V_{DS}$ of the second power switch 120 dropped between the drain connection and the source connection of the second power switch 120 for various values of the second gate-source voltage $V_{GS}$ of the second power switch 120 dropped between the gate connection and the source connection of the second power switch 120.

The first power switch 110 configured as a FET or MOSFET may be in the current-limiting state of the first power switch 110 if the first power switch 110 is operated in the saturation region of the first power switch 110 in accordance with the first output characteristic curve set and a variation of the first control signal present at the first control connection 113 has an influence on the first forward current. This is the case in particular for all values of the first control signal for which the first forward current is approximately independent of the drain-source voltage ($V_{DS}$) of the first power switch 110, that is to say for which the first forward current in the first output characteristic curve set progresses parallel to the axis of the drain-source voltage $V_{DS}$ of the first power switch 110.

The second power switch 120 configured as a FET or MOSFET may be in the current-limiting state of the second power switch 120 if the second power switch 120 is operated in the saturation region of the second power switch 120 in accordance with the second output characteristic curve set and a variation of the second control signal present at the second control connection 123 of the second power switch 120 has an influence on the second forward current. This is the case in particular for all values of the second control signal for which the second forward current is approximately independent of the drain-source voltage ($V_{DS}$) of the second power switch 120, that is to say for which the second forward current in the second output characteristic curve set progresses parallel to the axis of the drain-source voltage $V_{DS}$ of the second power switch 120.

In alternative embodiments of the switch arrangement 105, the switch arrangement 105 may also be configured to apply a first current signal, for instance a first base current, as first control signal to the first control connection 113 of the first power switch 110 and/or a second current signal, for instance a second base current, as second control signal to the second control connection 123 of the second power switch 120.

The power switches 110, 120 are configured to take up the electrical power loss respectively arising in the power switches 110, 120 upon the limiting of the first and second forward currents. Typically, upon the limiting of the forward currents, an electrical power loss arises which is given by the product of the first forward current and the second forward current, respectively, and the voltage dropped across the power switches 110, 120. The maximum power loss able to be taken up by the power switches 110, 120 is specified in each case by a safe operating area of the power switches 110, 120, which indicates the maximum permissible first or second forward current depending on the voltage dropped across the relevant power switch 110, 120 and depending on the duration of the current limiting.

The first power switch 110 is configured to take up more power loss than the second power switch 120 in the current-limiting state. The first power switch 110 may be configured for example to take up twenty times, fifty times or seventy times more power loss than the second power switch 120. By way of example, the first power switch 110 may be configured to limit the first forward current to a maximum of 35 A given a voltage of 30 V dropped across the first power switch 110 for a duration of 10 ms, and the second power switch 120 may be configured to limit the second forward current to a maximum of 0.5 A given a voltage of 30 V dropped across the second power switch 120 for a duration of 10 ms.

The drive unit 130 is configured to generate the first control signal for the first power switch 110 and to apply it to the first control connection 113 of the first power switch 110. Moreover, the drive unit 130 is configured to generate the second control signal for the second power switch 120 and to apply it to the second control connection 123 of the second power switch 120. The drive unit 130 comprises a first control output 132, which is connected to the first control connection 113 of the first power switch 110, and a second control output 133, which is connected to the second control connection 123 of the second power switch 120. The drive unit 130 is configured to apply the first control signal to the first power switch 110 via the first control output 132 and to apply the second control signal to the second power switch 120 via the second control output 133.

The first control signal present at the first control connection 113 of the first power switch 110 and the second control signal present at the second control connection 123 of the second power switch 120 can be identical. However, the control signals may also be different. In the case of the switch arrangement 105 illustrated in FIG. 1, the drive unit 130 is connected to the first and second power switches 110, 120 in each case via separate control lines.

The switch arrangement 105 with the drive unit 130 and the two power switches 110, 120 electrically connected in parallel is configured to interrupt the current flowing between the input 102 and the output 104 in a current blocking state of the switch arrangement 105, to limit said current in a current-limiting state of the switch arrangement 105 and to conduct said current in a current conducting state of the switch arrangement 105. In the current blocking state of the switch arrangement 105, both the first power switch 110 and the second power switch 120 are in each case in the interrupting state. In the current conducting state of the switch arrangement 105, the second power switch 120 is in the conducting state of the second power switch 120 and the first power switch 110 may be in the conducting state or in the current-limiting state of the first power switch 110. In the current limiting state of the switch arrangement 105, the first power switch 110 is in the current-limiting state of the first power switch 110 and the second power switch 120 is in the interrupting state of the second power switch 120.

Thus, in the current-limiting state of the switch arrangement 105, the current flowing between the input 102 and the output 104 flows exclusively via the first power switch 110 and the power loss that arises during the current limiting arises exclusively in the first power switch 110. Since the on resistance of the second power switch 120 is less than the on resistance and the variable limiting resistance of the first power switch 110, in the current conducting state of the switch arrangement 105 a large portion of the current flowing between the input 102 and the output 104 flows via the second power switch 120.

The drive unit 130 is configured, in the current blocking state of the switch arrangement 105, to apply the first interrupting signal to the first power switch 110 and the second interrupting signal to the second power switch 120. The drive unit 130 is configured, in the current conducting state of the switch arrangement 105, to apply the first conducting signal or the first limiting signal to the first power switch 110 and the second conducting signal to the second power switch 120. The drive unit 130 is configured, in the current-limiting state of the switch arrangement 105, to apply the first limiting signal to the first power switch 110 and the second interrupting signal to the second power switch 120.

The switch arrangement 105 is configured, for the purpose of limiting the current flowing between the input 102 and the output 104, firstly to transfer the second power switch 120 from the conducting state of the second power switch 120 to the interrupting state of the second power switch 120 and only afterward to transfer the first power switch 110 from the conducting state of the first power switch 110 to the current-limiting state of the first power switch 110. For this purpose, the switch arrangement 105 may firstly apply the second interrupting signal to the second power switch 120 and may continue to apply the first conducting signal to the first power switch 110 and only afterward apply the first limiting signal to the first power switch 110.

The drive unit 130 is configured to end the limiting of the current flowing between the input 102 and the output 104, that is to say to transfer the switch arrangement 105 from the current-limiting state to the current conducting state again, by virtue of the drive unit 130 firstly ending the limiting of the first forward current by the first power switch 110, that is to say transferring the first power switch 110 from the current-limiting state of the first power switch 110 once again to the conducting state of the first power switch 110, and only afterward ending the interrupting of the second forward current by the second power switch 120, that is to say transferring the second power switch 120 from the interrupting state of the second power switch 120 once again to the conducting state of the second power switch 120. In particular, the drive unit 130 may be configured firstly to apply once again the first conducting signal as first control signal to the first power switch 110 and to continue to apply the second interrupting signal to the second power switch 120 and only afterward to apply once again the second conducting signal as second control signal to the second power switch 120.

The drive unit 130 is connected to an output of the current measuring unit 150 in order to receive the current measurement signal generated by the current measuring unit 150. Information about the current intensity of the current flowing through the switch arrangement 105 is thus available to the drive unit 130. The protective device 100 also comprises a voltage measuring unit 140 besides the current measuring unit 150. The voltage measuring unit 140 is configured to measure the voltage dropped across the switch arrangement 105 on the supply line 4 and to generate a voltage signal representing the voltage. The voltage measuring unit 140 is connected to a first measurement point 141 at the input connections 111, 121 of the power switches 110, 120 and to a second measurement point 142 at the output connections 112, 122 of the power switches 110, 120. The voltage measuring unit 140 is configured to measure the voltage dropped between the measurement points 141, 142. The drive unit 130 is connected to the voltage measuring unit 140 in order to receive the voltage measurement signal. Information about the voltage value of the voltage dropped across the switch arrangement 105 is thus available to the drive unit 130.

The current measuring unit 150 and/or the voltage measuring unit 140 may also be integrated in the drive unit 130. In particular, the drive unit 130 may be directly connected to the first measurement point 141, the second measurement point 142 and to a third measurement point, wherein the third measurement point is arranged between the input 102 and a measuring resistor connected into the supply line 4 instead of the current measuring unit 150.

The drive unit 130 is configured to limit the current flowing between the input 102 and the output 104 or the current flowing through the switch arrangement 105 in the current-limiting state of the switch arrangement 105 on the basis of an intensity of the current flow through the switch arrangement 105 and/or on the basis of the voltage dropped across the switch arrangement 105 in such a way that the first power switch 110 is operated in a safe operating area of the first power switch 110.

In particular, the drive unit 130 may be configured to limit the current flowing through the switch arrangement 105 or the current flowing between the input 102 and the output 104 to a predefined maximum current. In this case, the drive unit 130 is configured to dimension the first control signal applied to the first power switch 110 in such a way that the first power switch 110 in the current-limiting state of the first power switch 110 limits the first forward current to the predefined maximum current.

The drive unit 130 may be configured to monitor a duration of the limiting of the current to the predefined maximum current and to compare said duration with a predefined duration. Moreover, the drive unit 130 is configured to interrupt the current flowing between the input 102 and the output 104 and the current flowing through the switch arrangement 105, that is to say to transfer both the first power switch 110 and the second power switch 120 to the interrupting state, if the predefined duration is exceeded during the limiting of the flowing current to the maximum current. The predefined duration may correspond for example to the duration for which the first power switch 110 is permitted to be loaded with the maximum current at the voltage dropped across the switch arrangement 105 in accordance with the safe operating area of the first power switch 110.

Moreover, the drive unit 130 may be configured to determine the power loss that arises in the first power switch 110 on the basis of the measured current intensity and the measured voltage. The drive unit 130 may be configured to compare the power loss that arises with a predefined value of a maximum power loss and, in the event of the maximum power loss being exceeded, to limit the current flow through the switch arrangement 105 taking account of the voltage dropped across the switch arrangement 105 in such a way that the maximum power loss is not exceeded.

The drive unit 130 may be configured for example to limit the current flowing between the input 102 and the output 104 to a maximum current of less than 100 A, of less than 50 A, in particular of 25 A. The drive unit 130 may be configured to limit the power loss that arises during the limiting of the current to a maximum power loss of 400 W for a duration of 10 ms.

Figure 2:
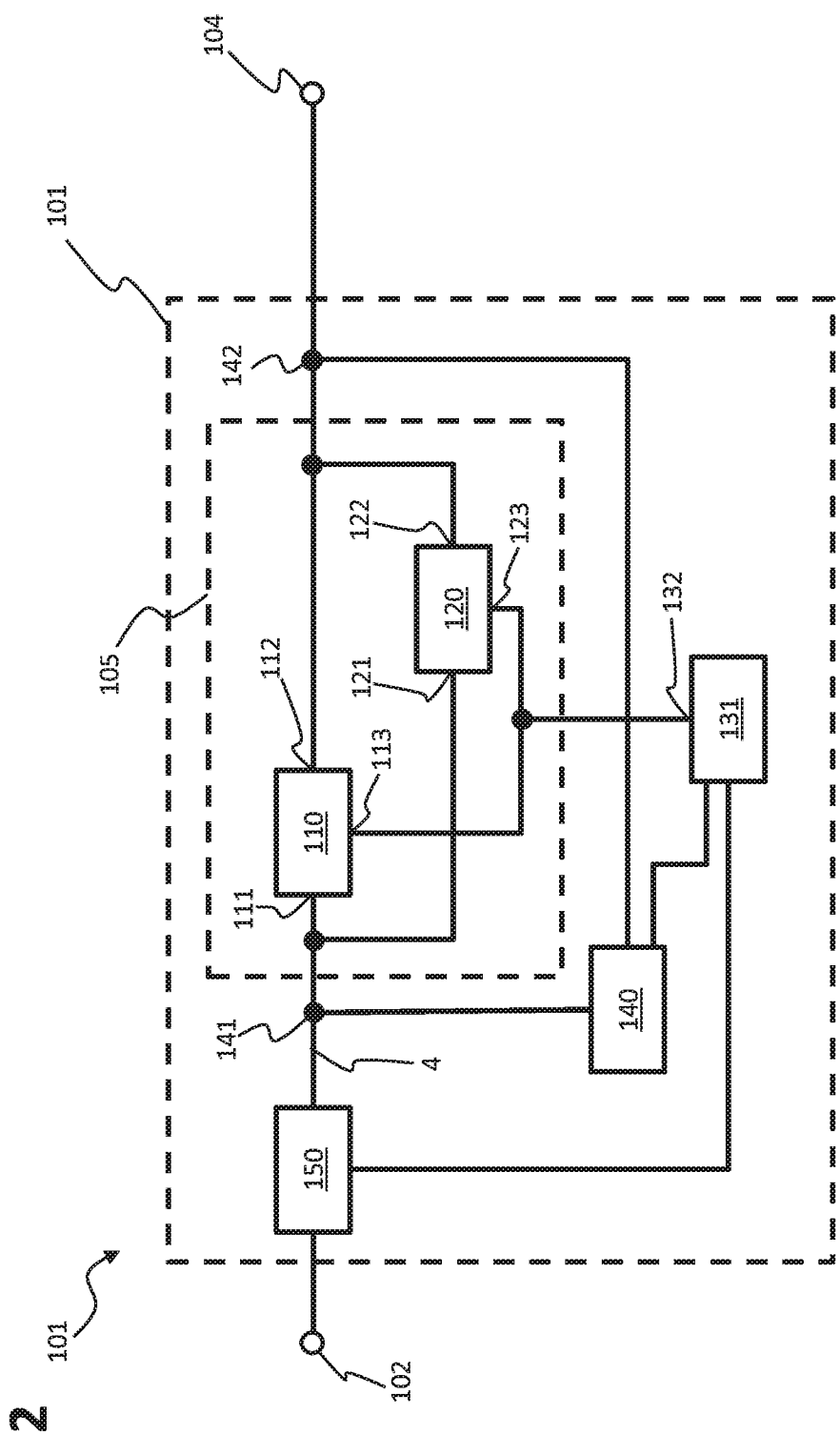
FIG. 2 shows a further protective device.

FIG. 2 shows a schematic illustration of a further protective device 101. In so far as differences not described below, the further protective device 101 may be configured like the protective device 100 illustrated in FIG. 1.

In particular, the further protective device 101 comprises the switch arrangement 105 comprising the first power switch 110 and the second power switch 120. In so far as differences not described below, the first power switch 110 and the second power switch 120 of the switch arrangement 105 of the further protective device 101 may be configured like the first and second power switches 110, 120 of the protective device 100 illustrated in FIG. 1.

The further protective device 101 comprises a further drive unit 131 instead of the drive unit 130. In so far as differences not described below, the further drive unit 131 may be configured like the drive unit 130 of the protective device 100. In the case of the further protective device 101, a common control signal is applied to the first and second power switches 110, 120. The further drive unit 131 comprises only the first control output 132. In the case of the further protective device 101, the first control connection 113 of the first power switch 110 and the first control connection 123 of the second power switch 120 are jointly connected to the first control output 132 of the further drive unit 131.

In particular, the first control output 132 of the further drive unit 131 is connected both to the first control input 113 of the first power switch 110 and to the second control input 123 of the second power switch. As a result, the common control signal is applied both to the first control connection 113 of the first power switch 110 and to the second control connection 124 of the second power switch 120. The common control signal is applied in particular both as the first control signal to the first control connection 113 of the first power switch 110 and as the second control signal to the second control connection 123 of the second power switch 120.

The further drive unit 131 is configured to apply a common interrupting signal as common control signal to the first and second power switches 110, 120 via the first control output 132, in order to interrupt the current flow between the input 102 and the output 104. If the common interrupting signal is present at the control inputs 113, 123 of the power switches 110, 120, the switch arrangement 105 is thus in the current blocking state. The further drive unit 131 is configured to apply a common limiting signal as common control signal to the first and second power switches 110, 120 via the first control output 132, in order to limit the current flow between the input 102 and the output 104. If the common limiting signal is present at the control inputs 113, 123 of the power switches 110, 120, the switch arrangement 105 is thus in the current-limiting state. The further drive unit 131 is configured to apply a common conducting signal as common control signal to the first and second power switches 110, 120 via the first control output 132, in order to conduct the current between the input 102 and the output 104. If the common conducting signal is present at the control inputs 113, 123 of the power switches 110, 120, the switch arrangement 105 is thus in the current conducting state.

In the case of the further protective device 101, the second power switch 120 is configured to conduct the second forward current in the conducting state of the second power switch 120 if the common conducting signal is present at the second control connection 123 of the second power switch 120. In addition, in the case of the further protective device 101, the first power switch 110 may be configured to conduct the first forward current in the conducting state of the first power switch 110 if the common conducting signal is present at the first control connection 113 of the first power switch 110.

In the case of the further protective device 101, the first power switch 110 is configured to limit the first forward current in the current-limiting state of the first power switch 110 if the common limiting signal is present at the first control connection 113 of the first power switch 110, and the second power switch 120 is configured to interrupt the second forward current in the interrupting state of the second power switch 120 if the common limiting signal is present at the second control connection 113 of the second power switch 120.

In the case of the further protective device 101, the first power switch 110 is configured to interrupt the first forward current in the interrupting state of the first power switch 110 if the common interrupting signal is present at the first control connection 113 of the first power switch 110, and the second power switch 120 is configured to interrupt the second forward current in the interrupting state of the second power switch 120 if the common interrupting signal is present at the second control connection 113 of the second power switch 120.

Like the first power switch 110 of the protective device 100, the first power switch 110 of the further protective device 101 is also configured to limit the first forward current in the current-limiting state of the first power switch 110 if the common control signal present at the first control connection 113 of the first power switch 110 comprises a value that lies in the first value range. In this case, the first value range once again comprises all values between the first upper limit value and the first lower limit value lying below the first upper limit value. The first power switch 110 is configured to conduct the first forward current in the conducting state of the first power switch 110 if the common control signal comprises a value that lies above the first upper limit value. The first power switch 110 is configured to interrupt the first forward current in the interrupting state of the first power switch 110 if the common control signal comprises a value that lies below the first lower limit value.

Like the second power switch 120 of the protective device 100, the second power switch 120 of the further protective device 101 is also configured to limit the second forward current in the current-limiting state of the second power switch 120 if the common control signal present at the second control connection 123 of the second power switch 120 comprises a value that lies in the second value range. In this case, the second value range once again comprises all values between the second upper limit value and the second lower limit value lying below the second upper limit value. The second power switch 120 is configured to conduct the second forward current in the conducting state of the second power switch 120 if the common control signal comprises a value that lies above the second upper limit value. The second power switch 120 is configured to interrupt the second forward current in the interrupting state of the second power switch 120 if the common control signal comprises a value that lies below the second lower limit value. If the second power switch 120 does not comprise a current-limiting state, then the first upper limit value and the first lower limit value may also be identical and the second value range may be omitted.

In the case of the power switches 110, 120 of the further protective device 101, the second lower limit value is greater than the first lower limit value. The common control signals functioning as common limiting signals then comprise values that lie between the first lower limit value and the second lower limit value.

Alternatively, in the case of the further protective device 101, too, the first power switch 110 may be configured to interrupt the first forward current in the interrupting state of the first power switch 110 if the common control signal comprises a value that lies above the first upper limit value, and to conduct the first forward current in the conducting state of the first power switch 110 if the common control signal comprises a value that lies below the first lower limit value. At the same time the second power switch 120 may be configured to interrupt the second forward current in the interrupting state of the second power switch 120 if the common control signal comprises a value that lies above the second upper limit value, and to conduct the second forward current in the conducting state of the second power switch 120 if the common control signal comprises a value that lies below the second lower limit value. In this case, the second upper limit value is less than the first upper limit value. The common control signals functioning as common limiting signals then comprise values that lie between the first upper limit value and the second upper limit value.

Analogously to the protective device 100, in the case of the further protective device 101, too, the switch arrangement 105 may be configured to the effect that the common control signal is applied as a control voltage to the first control connection 113 of the first power switch 110 and to the second control connection 123 of the second power switch 120. The control voltage may be given by the voltage drop between the control connections 113, 123 of the power switches 110, 120 and the input connections 111, 121 of the power switches 110, 120. Alternatively, the control voltage may be given by the voltage drop between the control connections 113, 123 of the two power switches 110, 120 and the output connections 112, 122 of the power switches 110, 120. The control voltage may be applied in each case as a gate voltage to the first power switch 110 and the second power switch 120. By way of example, the control voltage may be the voltage dropped between the control connections 113, 123 configured as gate connections of the power switches 110, 120 and the input connections 111, 121 configured as source connections of the power switches 110, 120.

Analogously to the protective device 100 in the case of the further protective device 101, too, the first and second power switches 110, 120 may be configured in each case as a semiconductor switch. In this case, the first threshold voltage of the first power switch 110 may correspond to the first lower limit value and the second threshold voltage of the second power switch 120 may correspond to the second lower limit value and the first power switch 110 may be configured to assume the interrupting state of the first power switch 110 and to interrupt the first forward current if the control voltage falls below the first threshold voltage. The second power switch 120 may then be configured to assume the interrupting state of the second power switch 120 and to interrupt the second forward current if the control voltage falls below the second threshold voltage. In this case, the second threshold voltage of the second power switch 120 is greater than the first threshold voltage of the first power switch 110. The voltage values of the common control voltage functioning as common limiting signal then lie between the first and second threshold voltages.

By way of example, the first power switch 110 may comprise a first threshold voltage of 1.2 V to 2 V, in particular of 1.6 V, and the second power switch 120 may comprise a second threshold voltage of 2.1 V to 3.3 V, in particular of 2.8 V. In particular, there may be a voltage difference of more than 1 V between the threshold voltage of the first power switch 110 and the threshold voltage of the second power switch 120 or the threshold voltage of the first power switch 110 may be less than the threshold voltage of the second power switch 120 by more than 1 V.

Figure 3:
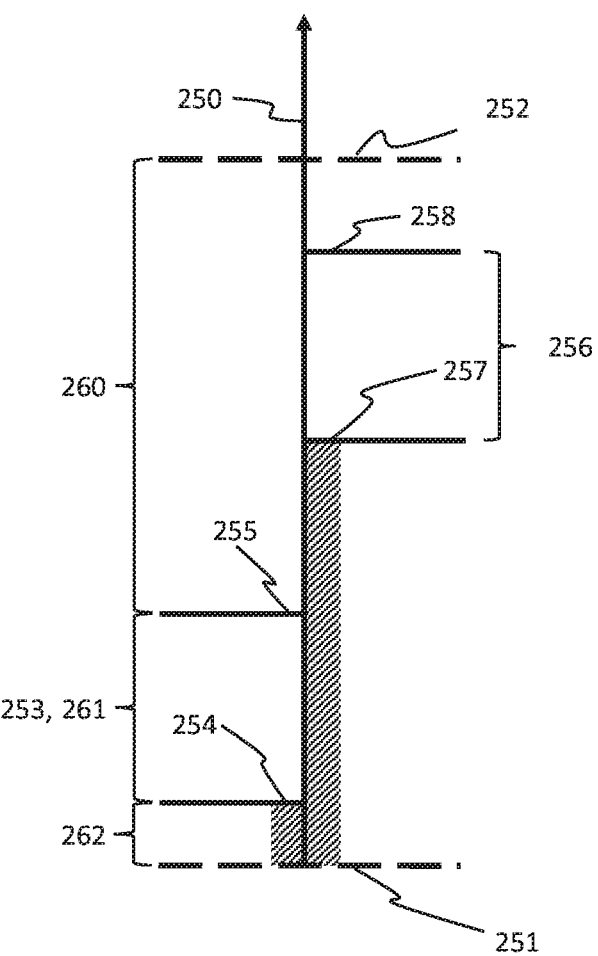
FIG. 3 shows a control signal output by the further protective device.

FIG. 3 shows by way of example a schematic illustration of the common control signal 250 of the further protective device 101 in accordance with FIG. 2, said common control signal being output via the first control output 132 of the further drive unit 131. The further drive unit 131 is configured to vary a value, or a signal level, of the control signal 250 between a minimum signal level 251 and a maximum signal level 252 lying above the minimum signal level 251. If the control signal 250 is output as the control voltage, the minimum signal level 251 may be 0 V, for example, and the maximum signal level 252 may be 12 V. The further drive unit 131 may be configured to vary the control signal 250 continuously variably between the minimum signal level 251 and the maximum signal level 252, that is to say to output the control signal 250 for example as an analog control signal. However, the further drive unit 131 may also be configured to vary the control signal 250 in steps between the minimum signal level 251 and the maximum signal level 252, that is to say to output the control signal 250 for example as a digital control signal.

In addition, FIG. 3 shows the first lower limit value 254, the first upper limit value 255 and the first value range 253 of the first power switch 110, said first value range lying between the first lower limit value 254 and the first upper limit value 255. Likewise, FIG. 3 illustrates the second lower limit value 257, the second upper limit value 258 and the second value range 256 of the second power switch 120, said second value range lying between the second lower limit value 257 and the second upper limit value 258.

In the case of the embodiment of the switch arrangement 105 on which FIG. 2 is based, the first power switch 110 is configured to assume the interrupting state of the first power switch 110 if the value of the control signal 250, that is to say for example the value of the control voltage, lies below the first lower limit value 254, and the second power switch 120 is configured to assume the interrupting state if the value of the control signal 250, that is to say for example the value of the control voltage, lies below the second lower limit value 257. The interrupting state of the first power switch 110 and the interrupting state of the second power switch 120 are illustrated in FIG. 3 in each case as a hatched area below the first lower limit value 254 for the first power switch 110 and below the second lower limit value 257 for the second power switch 120.

The first power switch 110 is configured to assume the current-limiting state of the first power switch 110 if the value of the control signal 250, that is to say for example the value of the control voltage, lies in the first value range 253, while the second power switch 120 is configured to assume the current-limiting state of the second power switch 120 if the value of the control signal 250, that is to say for example the value of the control voltage, lies in the second value range 256. The first power switch 110 is configured to assume the conducting state of the first power switch 110 if the value of the control signal 250, that is to say for example the value of the control voltage, lies above the first upper limit value 255, while the second power switch 120 is configured to assume the conducting state of the second power switch 120 if the value of the control signal 250, that is to say for example the value of the control voltage, lies above the second upper limit value 258.

If the first power switch 110 is configured as a FET or MOSFET, then the first lower limit value 254 corresponds to the first threshold voltage of the first power switch 110. The first upper limit value 255 then corresponds to a control voltage, for example a gate-source voltage ($V\_\{GS\}$) dropped between the first control connection 113 and the first input connection 111 of the first power switch 110, above which the first power switch 110 opposes the first forward current only with the on resistance}) of the first power switch 110. In this case, in particular, the first upper limit value 255 may be dependent on the voltage dropped between the first input connection 111 and the first output connection 112 of the first power switch 110, for example on a drain-source voltage ($V\_\{DS\}$). In this respect, the first upper limit value 255 may be variable.

The first power switch 110 configured as a FET or MOSFET may be in the interrupting state if the first power switch 110 is operated in the off-state region of the first power switch 110 in accordance with the first output characteristic curve set of the first power switch 110.

The first power switch 110 configured as a FET or MOSFET may be in the current-limiting state of the first power switch 110 if the first power switch 110 is operated in the saturation region of the first power switch 110 in accordance with the first output characteristic curve set and a variation of the control voltage present at the first control connection 113 has an influence on the first forward current. This is the case in particular if the first forward current, for all values of the control signal 250 present at the first control connection 113 which are less than the first upper limit value 255, is approximately independent of the drain-source voltage ($V\_\{DS\}$) dropped between the first input connection 111 and the first output connection 112 of the first power switch 110, that is to say progresses parallel to the axis of the drain-source voltage $V\_\{DS\}$ in the output characteristic curve set.

If the second power switch 120 is configured as a FET or MOSFET, then the second lower limit value 257 corresponds to the second threshold voltage of the second power switch 120. The second upper limit value 258 then corresponds to a control voltage, for example a gate-source voltage ($V\_\{GS\}$) dropped between the second control connection 123 and the second input connection 121 of the second power switch 120, above which the second power switch 120 opposes the second forward current only with the on resistance}) of the second power switch 120. In this case, in particular, the second upper limit value 258 may be dependent on the voltage dropped between the second input connection 121 and the second output connection 122 of the second power switch 120, for example on the drain-source voltage ($V\_\{DS\}$). In this respect, the second upper limit value may be variable.

The second power switch 120 configured as a FET or MOSFET may be in the interrupting state if the second power switch 120 is operated in the off-state region of the second power switch 120 in accordance with the second output characteristic curve set of the second power switch 120. The second power switch 120 configured as a FET or MOSFET may be in the current-limiting state of the second power switch 120 if the second power switch 120 is operated in the saturation region of the second power switch 120 in accordance with the second output characteristic curve set and a variation of the control voltage present at the second control connection 123 has an influence on the second forward current. This is the case in particular if the second forward current, for all values of the control voltage present at the second control connection 123 which are less than the second upper limit value 258, is approximately independent of the voltage ($V\_\{DS\}$) dropped between the second input connection 121 and the second output connection 122 of the second power switch 120, that is to say progresses parallel to the axis of the drain-source voltage $V\_\{DS\}$ dropped between the second input connection 121 and the second output connection 122 of the second power switch 120 in the output characteristic curve set.

The two power switches 110, 120 in each case constitute a limiting resistance in their current-limiting states for electrical paths respectively located between the first and second input connections 111, 121 and the first and second output connections 112, 122 of the two power switches 110, 120. The magnitude of the limiting resistance may be variable. By way of example, the magnitude of the limiting resistance may be dependent on the control signal 250 present at the first and second control connections 113, 123, in particular on the gate-source voltage ($V\_\{GS\}$) dropped between the control connections 113, 123 and the input connections 111, 121.

As is illustrated in FIG. 3, the second lower limit value 257 of the second power switch 120 is greater than the first lower limit value 254 of the first power switch 110. By way of example, the second lower limit value 257 may comprise a value of 2.8 V and the first lower limit value 254 may comprise a value of 1.6 V.

The first lower limit value 254 may lie within a first limit value range owing to component tolerances of the first power switch 110. The first limit value range may comprise all values between a minimum first lower limit value and a maximum first lower limit value. The second lower limit value 257 may lie within a second limit value range owing to component tolerances of the second power switch 120. The second limit value range may comprise all values between a minimum second lower limit value and a maximum second lower limit value. In the case of the further protective device 101, the minimum second lower limit value is greater than the maximum first lower limit value. By way of example, the minimum second lower limit value may be greater than the maximum first lower limit value by more than 0.05 V, more than 0.1 V or more than 0.5 V. The maximum first lower limit value may be 2 V, for example, and the minimum second lower limit value 2.1 V.

As is likewise illustrated in FIG. 3, the first upper limit value 255 of the first power switch 110 is less than the second lower limit value 257 of the second power switch 120. In alternative embodiments of the further protective device 101, the first upper limit value 255 may correspond to the second lower limit value 257.

If the value of the control signal 250 lies above the second upper limit value 258, in particular between the maximum signal level 252 and the second upper limit value 258, the first power switch 110 is in the conducting state of the first power switch 110 and the second power switch 120 is in the conducting state of the second power switch 120. Since the on resistance of the first power switch 110 is greater than the on resistance of the second power switch 120, the current flowing between the input 102 and the output 104 through the switch arrangement 105 flows almost completely via the second power switch 120. In this case, the switch arrangement 105 is in the current conducting state.

If the value of the control signal 250 lies between the second upper limit value 258 and the second lower limit value 257, the first power switch 110 is in the conducting state of the first power switch 110 and the second power switch 120 is in the current-limiting state of the second power switch 120. The first power switch 110 and the second power switch 120 are configured in such a way that the on resistance of the first power switch 110 in the conducting state is less than the limiting resistance of the second power switch 120 in the current-limiting state. In this case, the current flowing between the input 102 and the output 104 through the switch arrangement 105 flows almost completely via the first power switch 110. In this case, the switch arrangement 105 is in the current conducting state.

If the value of the control signal 250 lies between the second lower limit value 257 and the first upper limit value 255, the first power switch 110 is in the conducting state of the first power switch 110 and the second power switch 120 is in the interrupting state of the second power switch 120. In this case, the current flowing between the input 102 and the output 104 through the switch arrangement 105 flows completely via the first power switch 110. In this case, the switch arrangement 105 is in the current conducting state.

If the value of the control signal 250 lies between the first upper limit value 255 and the first lower limit value 254, the first power switch 110 is in the current-limiting state of the first power switch 110 and the second power switch 120 is in the interrupting state of the second power switch 120. In this case, the current flowing between the input 102 and the output 104 through the switch arrangement 105 flows completely via the first power switch 110 and is limited by the first power switch 110. In this case, the switch arrangement 105 is in the current-limiting state.

If the value of the control signal 250 lies below the first lower limit value 254, in particular between the first lower limit value 254 and the minimum signal level 252, the first power switch 110 is in the interrupting state of the first power switch 110 and the second power switch 120 is in the interrupting state of the second power switch 120. In this case, the current flowing between the input 102 and the output 104 through the switch arrangement 105 is interrupted. In this case, the switch arrangement 105 is in the current blocking state.

Overall the switch arrangement 105 is in the current conducting state if the value of the control signal 250 is greater than the first upper limit value 255. The control signal 250 functioning as the common conducting signal thus comprises all values 260 of the control signal 250 which are greater than the first upper limit value 255. The switch arrangement 105 is in the current-limiting state if the value of the control signal 250 is less than the first upper limit value 255 and greater than the first lower limit value 254. The control signal 250 functioning as the common limiting signal thus comprises all values 261 of the control signal 250 which are greater than the first lower limit value 254 and less than the first upper limit value 255. The switch arrangement 105 is in the current blocking state if the value of the control signal 250 is less than the first lower limit value 254. The control signal 250 functioning as the common interrupting signal thus comprises all values 262 of the control signal 250 which are less than the first lower limit value 254.

Figure 4:
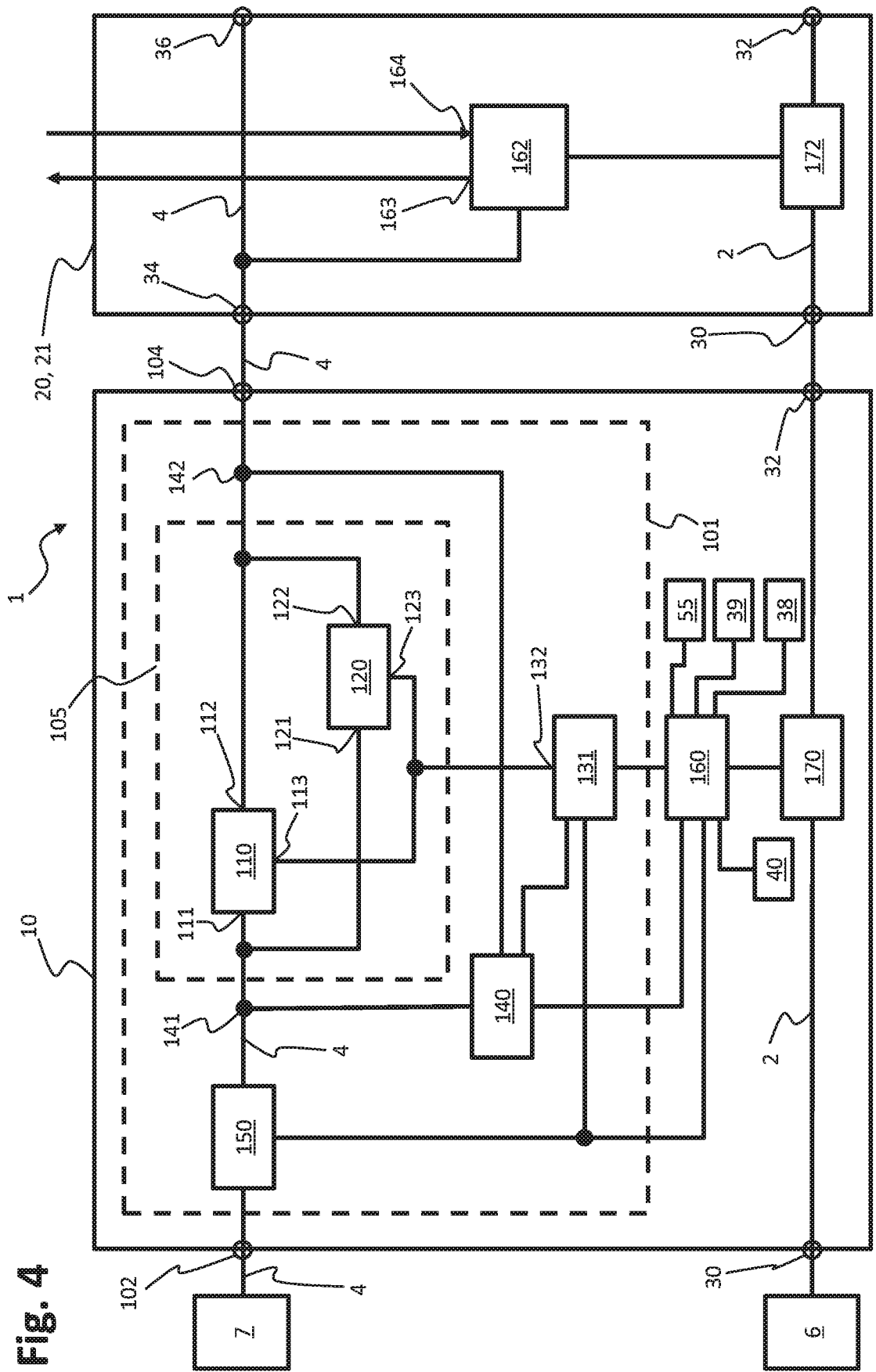
FIG. 4 shows a fieldbus system comprising a fieldbus module comprising the further protective device.

FIG. 4 shows a schematic illustration of a fieldbus system 1 comprising a controller 6, an energy supply device 7, a fieldbus module 10 and a further fieldbus module 20. The fieldbus system 1 comprises a fieldbus 2, via which the controller 6, the fieldbus module 10 and the further fieldbus module 20 are connected. The fieldbus 2 comprises a data line, via which the fieldbus modules 10, 20 connected to the fieldbus 2 and the controller 6 may exchange fieldbus data with one another. In this case, the controller 6 and the fieldbus modules 10, 20 function as fieldbus subscribers.

The data line may be configured as a network connection, in particular as a wired network connection. The data exchange via the fieldbus 2 may be carried out in accordance with an Ethernet-based fieldbus protocol. By way of example, the data exchange may be carried out in accordance with the EtherCAT or the Profibus standard. Via the fieldbus 2, input data and/or output data may be exchanged as fieldbus data between the fieldbus subscribers in order to control an automation process connected to the fieldbus system.

The further fieldbus module 20 comprises a module control device 162 and a module interface unit 172. The module interface unit 172 is connected to the fieldbus 2 and configured to exchange the fieldbus data via the fieldbus 2. By way of example, the module interface unit 172 may be configured to exchange the fieldbus data with the controller 6, the fieldbus module 10 or further fieldbus subscribers. The module interface unit 172 is connected to a module control device 162 of the further fieldbus module 20 in order to exchange the fieldbus data with the module control device 162.

The module control device 162 comprises a process input 164 and a process output 163. The module control device 162 is configured to read in input signals from sensors connected to the automation process via the process input 164, to convert the input signals into input data and to transmit the input data as fieldbus data via the module interface unit 172 and the fieldbus 2 for example to the controller 6. Moreover, the module control device 162 is configured to receive output data as fieldbus data for example from the controller 6 via the fieldbus 2 and the module interface unit 172 and, on the basis of the output data, to generate output signals for actuators connected to the automation process. The module control device 162 is additionally configured to output the output signals via the process output 163 to the actuators connected to the process output 163.

The module control device 162 may be configured as a microcontroller, an application specific integrated circuit (ASIC) or as a field programmable gate array (FPGA). Likewise, the module interface unit 172 may be configured as a microcontroller, an ASIC or an FPGA. The module control device 162 and the module interface unit 172 may also be integrated in a common microcontroller, FPGA or ASIC. The further fieldbus module 20 also comprises the process input 164 besides the process output 163 and is thus configured as an input/output module. Alternative embodiments of the further fieldbus module 20 may also be configured as a pure output module without the process input 164 or as a pure input module without the process output 163.

The energy supply device 7 is configured to provide an electrical supply energy for the operation of the process output 163 and of the process input 164. The supply energy may be provided for example as a supply voltage or field voltage. The supply energy may be provided in particular as a DC voltage, for instance comprising a voltage of between 1 V and 100 V, in particular comprising a voltage of between 10 V and 50 V, in particular comprising a voltage of 24 V. The supply energy may be provided in a manner electrically insulated and galvanically isolated from an energy supply of the fieldbus 2. With the supply energy, actuators, for instance electric motors, connected to the fieldbus system 1 may be supplied or driven, and sensors connected to the fieldbus system 1 may be operated.

The module control device 162 is configured to generate the output signals for driving the actuators from the supply energy. In particular, signal levels of the output signals refer to the ground of the supply line. Alternatively or additionally, the further fieldbus module 20 may be configured to make the supply energy available to the field devices, in particular the actuators and/or the sensors, via field outputs not illustrated in FIG. 4. Via the field outputs, the supply energy may be made available in particular in a switched or clocked manner. A field device connected to one of the field outputs may additionally be connected to the process output 163 and/or the process input 164 for exchange of input and/or output signals.

The further fieldbus module 20 comprising the process output 163 for connecting the actuators and the process input 164 for connecting the sensors is connected to the energy supply device 7 via an electrical supply line 4. The supply line 4 may be embodied as galvanically isolated from the fieldbus 2. The further fieldbus module 20 is connected to the supply line 4 via a supply input 34 and a supply output 36. The further fieldbus module 20 is configured to receive the supply energy via the supply input 34 and to forward it via the supply output 36 to further fieldbus subscribers connected to the supply line 4. The module control device 162 is connected to the supply line 4 between the supply input 34 and the supply output 36 for the energy supply of the module control device 162.

The fieldbus module 10 is connected to the energy supply line 4 between the energy supply device 7 and the further fieldbus module 20. The fieldbus module 10 is connected to the energy supply device 7 via the input 102 and to the supply input 34 of the further fieldbus module 20 via the output 104. The fieldbus module 10 may be connected to the energy supply device 7 via the supply line 4 directly or else via further fieldbus subscribers. Likewise, the fieldbus module 10 may be connected to the further fieldbus module 20 via the supply line 4 directly or via further fieldbus subscribers. The fieldbus modules 10, 20 are connected in turn to the supply line 4 and are connected to the energy supply device 7 in turn via the supply line 4. In this case, the fieldbus module 10 is connected to the supply line 4 between the further fieldbus module 20 and the energy supply device 7.

The fieldbus module 10 is configured to be fed with the supply energy via the input 102 and to forward the supply energy via the output 104 to other fieldbus subscribers, in particular to the further fieldbus module 20.

The fieldbus module 10 comprises the further protective device 101 in accordance with FIG. 2 in order to conduct, limit or interrupt the current flowing between the input 102 and the output 104 via the supply line 4. The fieldbus module 10 is configured to safeguard, with the further protective device 101, the fieldbus subscribers connected to the supply line 4 downstream of the fieldbus module 10. By way of example, the fieldbus module 10 is configured, with the further protective device 101, to limit and/or interrupt the current flowing on the supply line 4 in the case of a short circuit of the supply line 4 or a short circuit of a consumer connected to the supply line 4, for example a field device. The fieldbus module 10 may also be configured to limit (inrush current limiting) the current flowing on the supply line 4 in the case of load changes at downstream fieldbus subscribers, in particular in the case of load changes at the process output 163 or the process input 164 of the further fieldbus module 20 or in the case of load changes at the field outputs. In alternative embodiments of the fieldbus system 1, the fieldbus module 10 may also comprise the protective device 100 illustrated in FIG. 1 instead of the further protective device 101, in order to interrupt, limit or conduct the current on the supply line 4.

The fieldbus module 10 comprises a control device 160 and an interface unit 170 connected to the control device 160. In so far as differences are not described below, the interface unit 170 of the fieldbus modules 10 is configured like the module interface unit 172 of the further fieldbus module 20. In particular, the interface unit 170 is connected to the fieldbus 2 in order to exchange fieldbus data via the fieldbus with further fieldbus subscribers, in particular with the controller 6.

The fieldbus module 10 is configured, inter alia, to exchange information relating to the limiting of the current of the supply energy on the supply line 4 with further fieldbus subscribers via the fieldbus 2. For this purpose, the control device 160 of the fieldbus module 10 is connected to the interface unit 170. In the context of exchanging information via the fieldbus 2, the fieldbus module 10, via the fieldbus 2, may either only transmit information to other fieldbus subscribers or only receive information from other fieldbus subscribers or both transmit information to other fieldbus subscribers and receive information from other fieldbus subscribers.

By way of example, the fieldbus module 10 may exchange the intensity of the current flowing between the input 102 and the output 104 or the voltage dropped across the switch arrangement 105 of the further protective device 101 as information via the fieldbus 2. Moreover, the information exchanged via the fieldbus 2 may relate to the state of the switch arrangement 105, in particular indicate whether the switch arrangement 105 is in the current conducting state, the current-limiting state or the current blocking state. Moreover, the information may comprise the duration for which the current-limiting state has already been maintained. The fieldbus module 10 may be configured in particular to transmit the information to the controller 6 via the fieldbus 2.

The information exchanged via the fieldbus 2 may also be the predefined maximum current to which the further protective device 101 limits the current flowing between the input 102 and the output 104, or the predefined maximum duration for which the further protective device 101 may limit the current flowing between the input 102 and the output 104 to the predefined maximum current. By way of example, the maximum current and/or the maximum duration may be predefined for the further protective device 101 by the controller 6 via the fieldbus 2. By way of example, the fieldbus module 10 may be configured to receive the information from the controller 6 via the fieldbus 2.

For exchanging the information via the fieldbus 2, the control device 160 of the fieldbus module 10 may be connected in particular to the current measuring unit 150 and/or to the voltage measuring unit 140 and/or to the further drive unit 131.

The control device 160 may give commands for controlling the switch arrangement 105 in particular to the further drive unit 131. A command for controlling the switch arrangement 105 may for example influence whether the conducting signal or the interrupting signal or the limiting signal is output at the first control output 132 of the further drive unit 131. Via the control device 160 it is likewise possible, for example, to set the maximum current to which the further protective device 101 limits the current flowing between the input 102 and the output 104, or the predefined maximum duration for which the further protective device 101 limits the current flowing between the input 102 and the output 104 to the predefined maximum current.

The control device 160 may be connected to a digital input 40. The digital input 40 may be formed at a module housing of the fieldbus module 10. With the aid of an input signal present at the digital input 40, by way of example, the control device 160 may be instructed to output a command to the further drive unit 131.

The control device 160 may be connected to at least one light emitting diode 55. The at least one light emitting diode 55 may be formed at a module housing of the fieldbus module 10, said module housing not being illustrated in FIG. 4. The state of the switch arrangement 105 may be visualized with the aid of the at least one light emitting diode 55. In particular, it is thus possible to indicate whether the switch arrangement 105 is in the current conducting state, the current-limiting state or the current blocking state.

The control device 160 may be connected to mechanical pushbuttons 38, 39. The mechanical pushbuttons 38, 39 may be formed at a module housing of the fieldbus module 10. With the aid of the mechanical pushbuttons 38, 39, it is possible to predefine for example the maximum current to which the further protective device 101 limits the current flowing between the input 102 and the output 104, or the predefined maximum duration for which the further protective device 101 limits the current flowing between the input 102 and the output 104 to the predefined maximum current.

Figure 5:
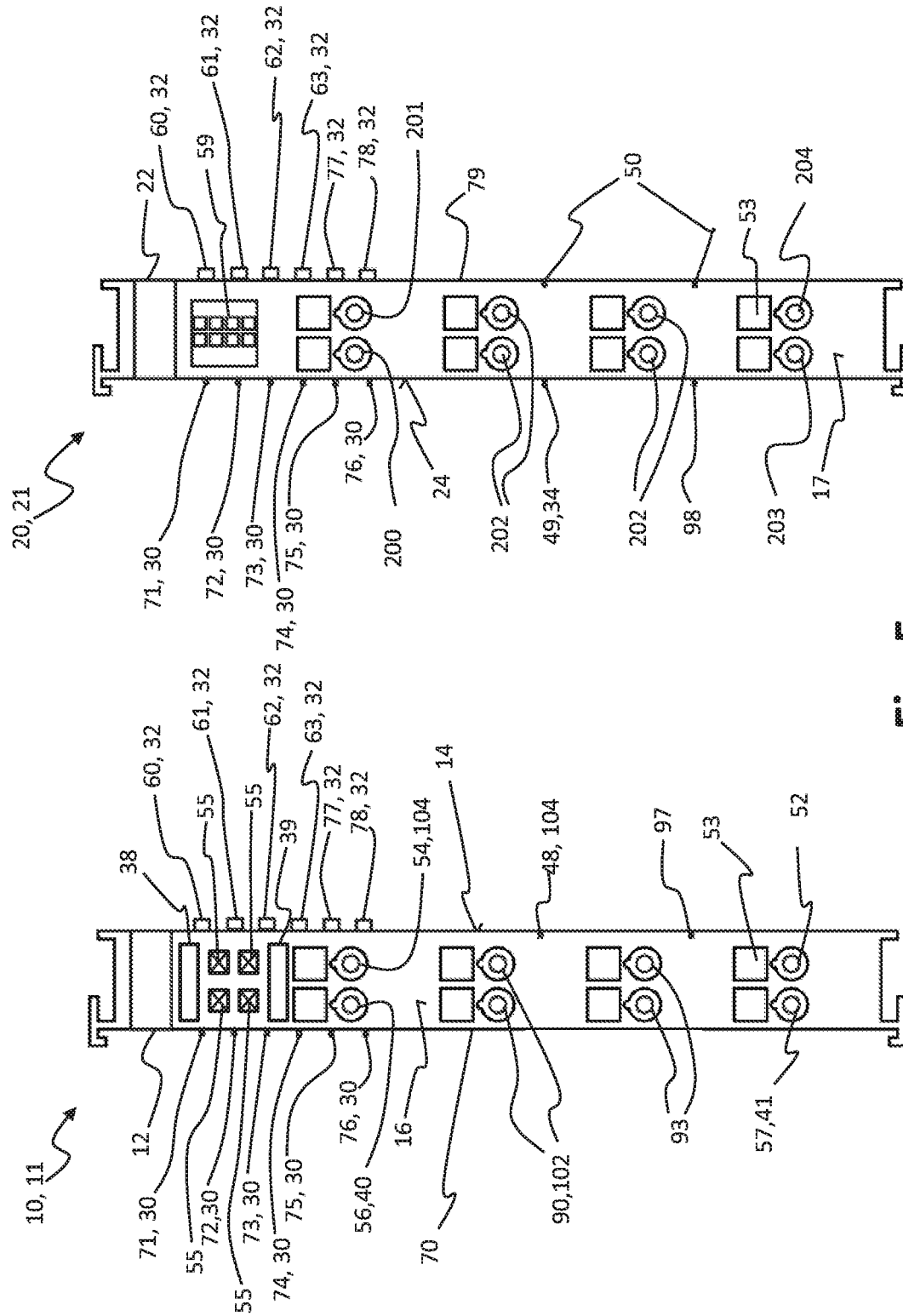
FIG. 5 shows a front view of the fieldbus module and of a further fieldbus module.

FIG. 5 shows a front view of the fieldbus module 10 in accordance with FIG. 4 and a front view of the signal module 20 in accordance with FIG. 4. The fieldbus module 10 and the signal module 20 are configured in each case as a bus terminal.

The switch arrangement 105, further drive unit 131, control device 160, interface unit 170, voltage measuring unit 140 and current measuring unit 150 described in connection with FIG. 4 are arranged in a module housing 12 of the fieldbus module 10 and are indiscernible in the illustration in FIG. 5. The module housing 12 and the elements of the fieldbus module 10 that are arranged therein may also be referred to as an overcurrent protective terminal 11. The module control device 162 of the further fieldbus module 20 and the module interface unit 172 of the further fieldbus module 20 described in connection with FIG. 4 are arranged in a further module housing 22 and are indiscernible in the illustration in FIG. 5. The further module housing 22 and the elements of the further fieldbus module 20 that are arranged therein may also be referred to as a signal terminal 21.

The module housing 12 of the overcurrent protective terminal 11 comprises a side face 14. The further module housing 22 of the signal terminal 21 comprises a further side face 24. The side face 14 is configured to be arranged directly adjacent to the further side face 24 in the mounted state. This may be gathered from FIG. 7, for example.

The output 104 for forwarding the supply energy is arranged in an exposed fashion at the side face 14 of the module housing 12 of the fieldbus module 10 in such a way that the output 104 is electrically contactable by the supply input 34 of the further fieldbus module 20, said supply input being arranged at the further side face 24 of the further fieldbus module 20, by the further side face being arranged directly adjacent to the side face 14 of the fieldbus module 10. The supply energy forwarded via the output 104 is also referred to by way of example hereinafter as safeguarded supply voltage or safeguarded supply energy.

The output 104 of the fieldbus module 10 for outputting the safeguarded supply voltage is formed at the side face 14 as a contact structure 48. In addition, a second contact structure 97 is formed at the side face, said second contact structure constituting for example the negative path, or 0 V path, or ground path of a supply voltage. The supply input 34 of the signal terminal 21 is formed as a further contact structure 49 at the further side face 24. The contact structure 48 is configured to bear directly against the further contact structure 49 for the purpose of forwarding the safeguarded supply energy to the signal terminal 21. This configuration of the contact structures analogously applies to the second contact structure 97 and a third contact structure 98 correspondingly formed at the signal terminal 21. As a result, the fieldbus module 10 or the overcurrent protective terminal 11 is able to be consecutively attached to the further fieldbus module 20 or the signal terminal 21. The overcurrent protective terminal 11 and the signal terminal 22 can thus be consecutively attached to form a terminal assemblage.

In the example illustrated in FIG. 5, the contact structure 48 and the second contact structure 97 are configured in the form of two grooves, while the further contact structure 49 and the third contact structure 98 are configured as two tongues corresponding to the grooves. However, it is not necessary for the contact structure 48, the second contact structure 97, the further contact structure 49 and the third contact structure 98 to be configured according to the tongue/groove principle. The contact structure 48, the second contact structure 97, the further contact structure 49 and the third contact structure 98 may for example also be configured as planar electrical contacts configured to bear against one another in order to forward the safeguarded supply energy to the signal terminal.

The signal terminal 21 comprises an additional contact structure 50 at a third side face 79 opposite the further side face 24, said additional contact structure being configured in the form of two grooves. In this way, the safeguarded supply energy may be forwarded to further fieldbus modules and/or signal terminals. The contact structures 48, 49, 50, 97, 98 configured according to the tongue/groove principle may also be referred to as power contacts. The power contacts make it possible that a separate cable wiring for forwarding the supply energy may be obviated.

The module housing 12 comprises an end face 16 configured in a manner extending transversely with respect to the side face 14. Two first contact elements 90 are formed at the end face 16, said first contact elements enabling the fieldbus module 10 to be electrically contacted by a cable being plugged in. The two first contact elements 90 are electrically conductively connected to one another, such that an arbitrary first contact element 90 may be used in the cabling of the overcurrent protective terminal 11. The first contact elements 90 constitute the input 102 for feeding in the supply energy, in particular a supply voltage, into the fieldbus module 10.

Furthermore, two second contact elements 93 are formed in the front side, said second contact elements enabling the fieldbus module 10 to be electrically contacted by a cable being plugged in. The two second contact elements 93 are electrically conductively connected to one another, such that an arbitrary second contact element 93 may be used in the cabling of the overcurrent protective terminal 11. The two second contact elements 93 constitute for example the negative path or 0 V path or ground path of the supply voltage.

Furthermore, a third contact element 54 is formed at the end face 16, said third contact element likewise constituting an output 104 for the safeguarded supply voltage. The contact structure 48 and the third contact element 54 are electrically connected to one another within the module housing 12, such that a user may arbitrarily choose whether he/she wishes to use for his/her application the output 104 formed at the side face 14 or the output 104 formed at the end face 16.

In addition, a fourth contact element 52 is formed at the end face 16, said fourth contact element constituting a further output for a safeguarded supply voltage. The protection terminal 11 may comprise two or more protective devices 100, 101 according to the invention. In particular, the protection terminal 11 may comprise a second protective device 100, 101, wherein the input of the second protective device 100, 101 is electrically connected to the input 102. The output of the second protective device 100,101 provides the further output and is electrically connected to the fourth contact element 52.

A fifth contact element 56 at the end face 16 constitutes a first digital input 40 for the fieldbus module 10. A first external pushbutton may be connected to the fifth contact element 56 in terms of data technology for example by cabling and thus control the fieldbus module 10, for example, as described in association with FIG. 4 for the pushbutton 38.

A sixth contact element 57 at the end face 16 constitutes a second digital input 41 for an overcurrent protective terminal 11. A second external pushbutton may be connected to the sixth contact element 57 in terms of data technology for example by cabling and thus control a fieldbus module 10, for example, as described in association with FIG. 4 for the pushbutton 39. The second digital input 41 may be provided for the second protective device 100, 101 provided that the overcurrent protective terminal 11 comprises the second protective device 100, 101. The control of the second protective device 100, 101 with the aid of the second digital input 41 is comparable with the control of the further protective device 101 illustrated in FIG. 4 with the aid of the first digital input 40.

The electrical connection and mechanical fixing of the cables described in the individual first to sixth contact elements 90, 93, 52, 54, 56, 57 are carried out for example with a tension spring terminal, also referred to as cage clamp, formed in each case in the individual first to sixth contact elements 90, 93, 52, 54, 56, 57.

A respective opening 53 is formed above the first to sixth contact elements 90, 93, 52, 54, 56, 57. The opening 53 is provided to receive a tool, for example a screwdriver. The cabling may thus be released from the respective first to sixth contact element 90, 93, 52, 54, 56, 57 or the respective spring force terminal. For reasons of clarity, only the opening 53 above the fourth contact element 52 is identified in FIG. 5.

The overcurrent protective terminal 11 comprises at its end face 16 the two pushbuttons 38, 39 for setting purposes, as described in association with FIG. 4. The light emitting diodes 55 for indicating information or events are likewise formed at the end face 16. In this regard, by way of example, a light emitting diode 55 may visualize the state of the switch arrangement in a color coded manner. Alternatively, provision may also be made for one or both of the pushbuttons 38, 39 described to be configured as luminous pushbutton comprising integrated illuminant, for example an LED. Pushbuttons of this type are also referred to as LED pushbuttons. If the pushbuttons 38, 39 described in association with FIG. 5 are configured as LED pushbuttons, information or events may also be indicated by the LED pushbuttons. In this regard, by way of example, the first LED pushbutton 38 and/or the second LED pushbutton 39 may visualize the switching state of the switch arrangement in a color coded manner. In this case, the light emitting diodes 55 may then be configured for indicating further or other information or events. This might be for example the status of the communication via the fieldbus 2.

Six contact pins are formed in an upper region at a second side face 70 of the fieldbus module 10 opposite the side face 14. The first contact pin 71 constitutes a positive path of a fieldbus energy input and the second contact pin 72 constitutes a negative path, or 0 V path, or ground path, not illustrated in FIG. 4, of the fieldbus energy input. A third contact pin 73, a fourth contact pin 74, a fifth contact pin 75 and a sixth contact pin 76 serve for the contacting of the overcurrent protective terminal 11 in terms of data technology and constitute four individual input or respectively output channels of the data line of the fieldbus 2. The first to sixth contact pins 71, 72, 73, 74, 75, 76 constitute the fieldbus input 30 of the fieldbus module 10.

Six spring contacts are formed at the side face 14 in an arrangement corresponding to the first to sixth contact pins 71, 72, 73, 74, 75, 76. The first spring contact 60 constitutes a positive path of a fieldbus energy output and the second spring contact 61 constitutes a negative path, or 0 V path, or ground path of the fieldbus energy output of the fieldbus 2. The third spring contact 62, the fourth spring contact 63, the fifth spring contact 77 and the sixth spring contact 78 likewise serve for contacting the overcurrent protective terminal 11 in terms of data technology and constitute four individual input or respectively output channels of that part of the fieldbus 2 which is referred to overall as communication channel. The first to sixth contact pins 60, 61, 62, 63, 77, 78 constitute the fieldbus output 32 of the fieldbus module 10.

The further side face 24 of the signal terminal 21 is configured analogously to the second side face 70 of the overcurrent protective terminal 11 with regard to the configuration of first to sixth contact pins 71, 72, 73, 74, 75, 76. Consequently, the first contact pin 71 of the signal terminal 21 contacts the first spring contact 60 of the overcurrent protective terminal 11. The second contact pin 72 of the signal terminal 21 contacts the second spring contact 61 of the overcurrent protective terminal 11. The third contact pin 73 of the signal terminal 21 contacts the third spring contact 62 of the overcurrent protective terminal 11. The fourth contact pin 74 of the signal terminal 21 contacts the fourth spring contact 63 of the overcurrent protective terminal 11. The fifth contact pin 75 of the signal terminal 21 contacts the fifth spring contact 77 of the overcurrent protective terminal 11. And the sixth contact pin 76 of the signal terminal 21 contacts the sixth spring contact 78 of the overcurrent protective terminal 11. Overall a continuous fieldbus 2 is thus provided.

The third side face 79 of the signal terminal 21 opposite the further side face 24 is configured analogously to the side face 14 of the overcurrent protective terminal 11 with regard to the configuration of the first to sixth spring contacts 60, 61, 62, 63, 77, 78. The first spring contact 60 constitutes a positive path of a fieldbus energy output and the second spring contact 61 constitutes a negative path, or 0 V path, or ground path of the fieldbus energy output of the signal terminal 21. A third spring contact 62, a fourth spring contact 63, a fifth spring contact 77 and a sixth spring contact 78 likewise serve for contacting the signal terminal 45 in terms of data technology and constitute four individual input or respectively output channels of that part of the fieldbus 2 which is referred to overall as data line.

The further module housing 22 of the signal terminal 21 comprises a further end face 17 formed transversely with respect to the further side face 24. A seventh contact element 200 is formed at the further end face 17. By plugging in a cable, an electrical connection to a field device, for example a first actuator, is produced by the seventh contact element 200, such that the seventh contact element 200 constitutes an output of the signal terminal 21 in order to supply the actuator with the safeguarded supply energy, or the safeguarded supply voltage. The output of the signal terminal 21 is not explicitly depicted in the case of the further fieldbus module 20 illustrated in FIG. 4, but is electrically conductively connected to the process output 163 of the control device 162 or to the field output of the further fieldbus module 20.

Furthermore, an eighth contact element 201, a ninth contact element 203 and a tenth contact element 204 are formed at the further end face 17. These further three contact elements 201, 203, 204 may constitute a further three outputs of the signal terminal 21 in order to supply further actuators in each case with the safeguarded supply voltage. Alternatively, the further three contact elements may constitute a further three inputs of the signal terminal 21 in order to connect further sensors to the signal terminal 21.

In addition, four eleventh contact elements 202 are formed at the further end face 17. By respectively plugging in a cable, the four eleventh contact elements 202 enable further field devices, for example actuators, to be electrically contacted.

The electrical connection and mechanical fixing of the cables described in the individual seventh to eleventh contact elements 200, 201, 202, 203, 204 are likewise carried out for example by a spring force terminal, or tension spring terminal, also referred to as cage clamp, formed in each case in the individual seventh to eleventh contact elements 200, 201, 202, 203, 204.

A respective opening 53 is likewise formed above the seventh to eleventh contact elements 200, 201, 202, 203, 204. The opening 53 is provided to receive a tool, for example a screwdriver. The cabling may thus be released from the respective seventh to eleventh contact elements 200, 201, 202, 203, 204 or the respective spring force terminal. For reasons of clarity, only the opening 53 above the eighth contact element 202 is identified in FIG. 5.

Additional pushbuttons and/or light emitting diodes 59 for indicating information may be formed at the further end face 17 of the signal terminal 20, as indicated in FIG. 4.

Figure 6:
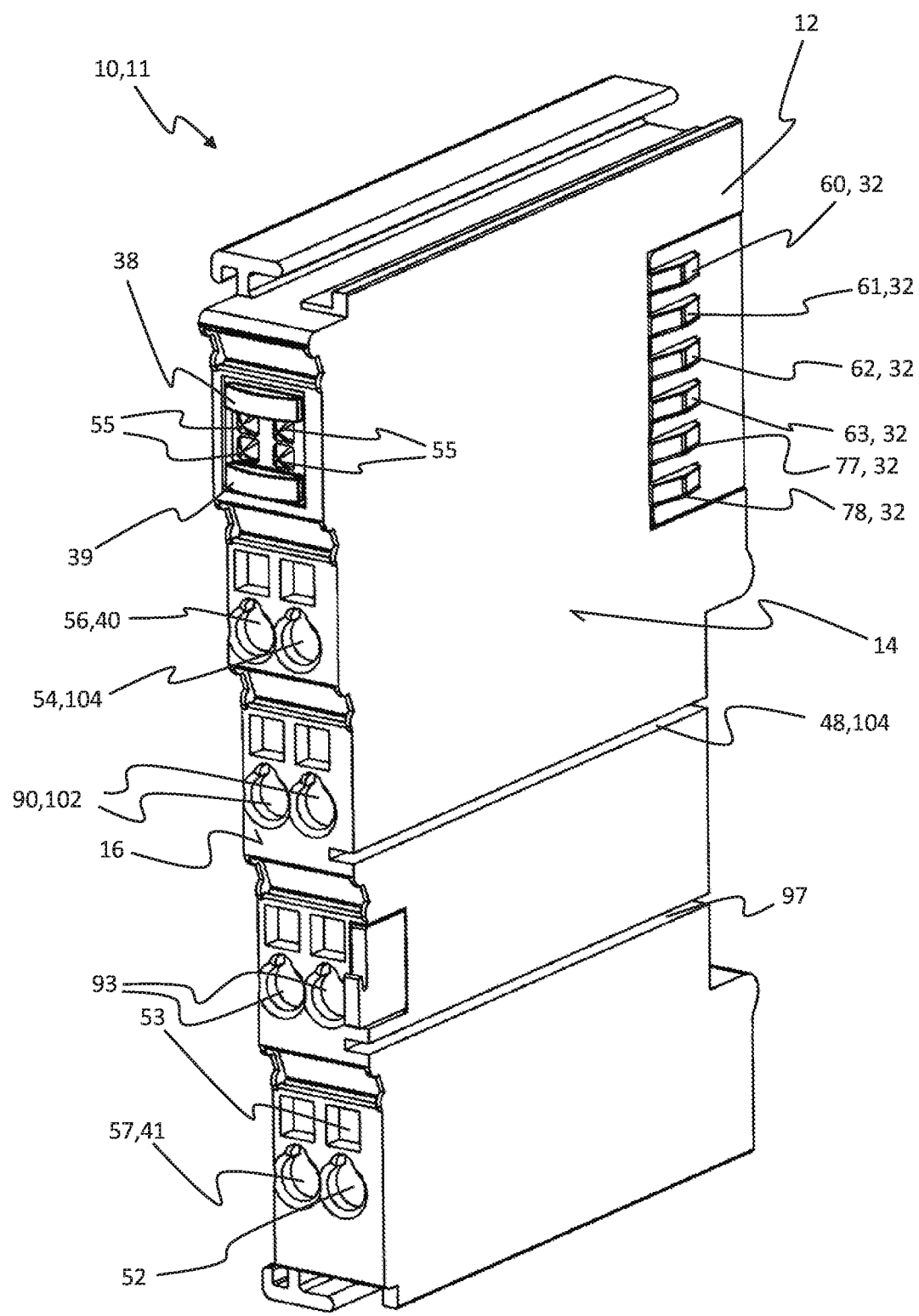
FIG. 6 shows a perspective view of the fieldbus module.

FIG. 6 shows a perspective view of the fieldbus module 10 configured as overcurrent protective terminal 11 in accordance with FIG. 5.

Figure 7:
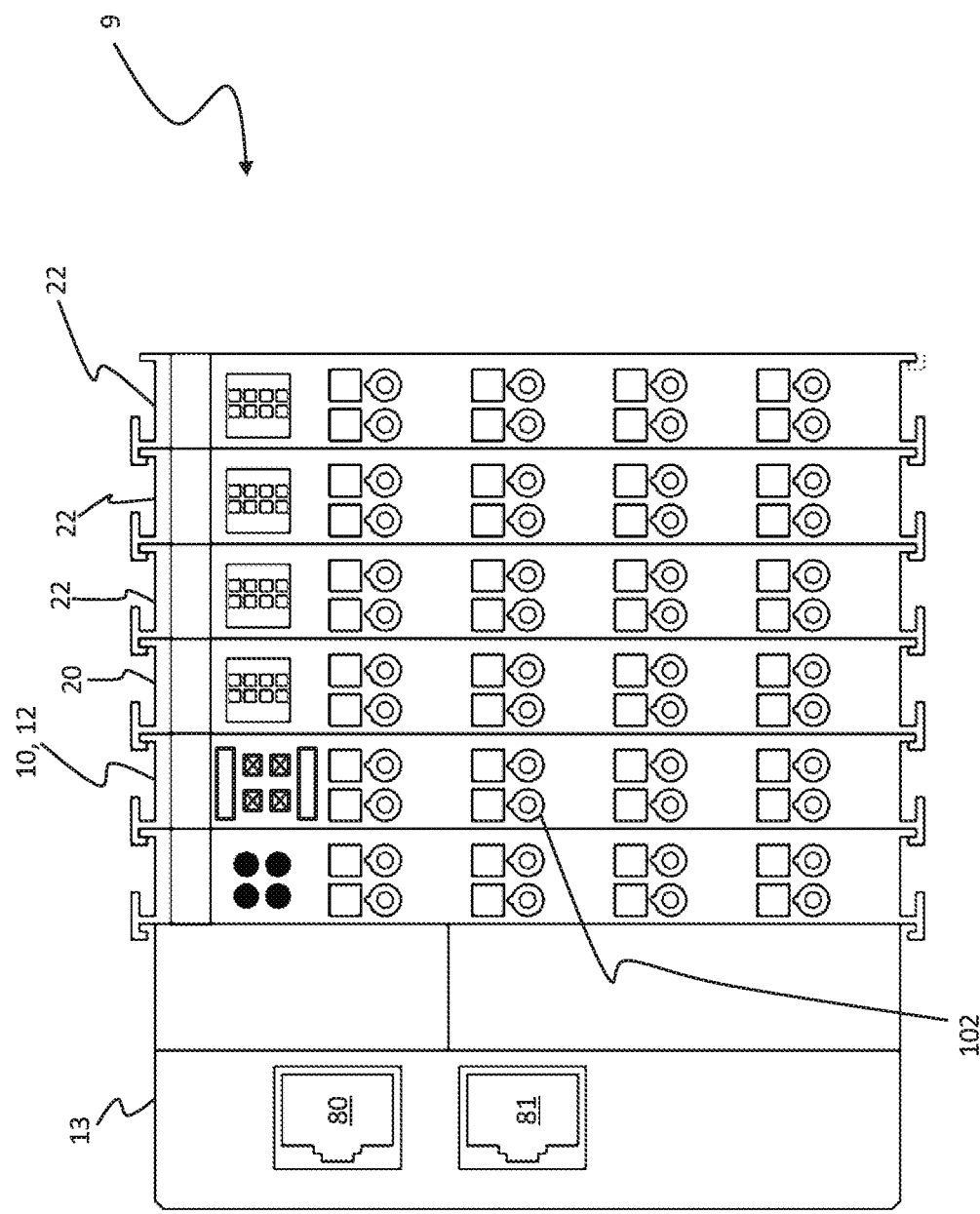
FIG. 7 shows a further fieldbus system comprising the fieldbus module.

FIG. 7 shows a further fieldbus system 9 comprising the fieldbus module 10 and the further fieldbus module 20. In the further fieldbus system 9, the further fieldbus module 20 is arranged directly adjacent to the fieldbus module 10. In particular, the further fieldbus module 20 is arranged with the further side face 24, comprising the supply input 34, directly adjacent to the side face 14, comprising the output 104, of the module housing 12 of the fieldbus module 10. The output 104 of the fieldbus module 10 and the supply input 34 of the further fieldbus module 20 are thus electrically conductively connected to one another.

In the further fieldbus system 9, at that side face of the further fieldbus module 20 comprises the supply output 36, a plurality of additional fieldbus modules 22 are arranged adjacent to one another in turn. The additional fieldbus modules 22 may be configured just like the further fieldbus module 20. In particular, the additional fieldbus modules 22 may comprise process inputs for connecting sensors and/or process outputs for connecting actuators. Moreover, the additional fieldbus modules 22 comprise a side face comprising the supply input 34 and a side face comprising the supply output 36. In each case two neighboring fieldbus modules from among the additional fieldbus modules 22 are arranged adjacent to one another in such a way that the supply output 36 of one neighboring additional fieldbus module 22 electrically conductively contacts the supply input 34 of the other neighboring additional fieldbus module 22. Proceeding from the fieldbus module 10 comprising the further protective device 101, the supply energy is forwarded in turn via the supply inputs 34 and the supply outputs 36 to the further fieldbus module 20 and the additional fieldbus modules 22.

An initial module 13 of the further fieldbus system 9 is arranged at the side face 70 of the fieldbus module 10 opposite the side face 14 comprising the output 104. The initial module 13 is arranged directly adjacent to the side face 70 of the fieldbus module 10 opposite the side face 14 comprising the output 104. The initial module 13 comprises a fieldbus output at the side face bearing against the fieldbus module 10, which fieldbus output may be configured like the fieldbus output 32 of the fieldbus module 10. The fieldbus output of the initial module 13 contacts the fieldbus input 30 of the fieldbus module 10. Via the fieldbus output of the initial module 13 and the fieldbus input 30 of the fieldbus module 10, the interface unit 170 of the fieldbus module 10 is connected to the initial module 13 via the fieldbus 2 in order to exchange fieldbus data.

The initial module 13 is configured to receive the input data generated by the fieldbus modules 10, 20, 22 and to send the output data addressed to the fieldbus modules 10, 20, 22. The initial module 13 illustrated in FIG. 7 is configured as a coupling module which connects the fieldbus 2, routed via the fieldbus inputs 30 and fieldbus outputs 32 formed at the side faces of the fieldbus modules 10, 20, 22, to a further fieldbus section and enables data exchange between the fieldbus 2 and the further fieldbus section. The data transmission on the further fieldbus section may be based on a different physical transmission technique and/or on a different transmission protocol with respect to the data transmission via the fieldbus 2 between the fieldbus modules 10, 20, 22. For linking to the further fieldbus section, the initial module 13 comprises a first fieldbus connection 80 and a second fieldbus connection 81. The first fieldbus connection 80 and the second fieldbus connection 81 may be configured as elements of a plug connection, for example as RJ-45 sockets. Via the further fieldbus section, the fieldbus modules 10, 20, 22 may be linked to a controller of the further fieldbus system 9 and/or further fieldbus modules in order to exchange the fieldbus data with the controller and/or the further fieldbus modules via the initial module 13 and the further fieldbus section.

The initial module 13 may also itself be configured as a controller, for instance as the controller 6 illustrated in FIG. 4. As a controller, the initial module 13 may read in input data from the fieldbus modules 10, 20, 22 exchanged via the fieldbus 2, logically combine said input data and process them to constitute output data. Moreover, the initial module 13 as controller may exchange the output data for controlling the automation process with the fieldbus modules 10, 20, 22 via the fieldbus 2.

The energy supply device 7 illustrated in FIG. 4 may be connected to the input 102 of the fieldbus module 10 comprising the protective device 101 in order to feed the fieldbus modules 10, 20, 22 with the supply energy. The supply energy may be fed into the further fieldbus system 9 via the fieldbus module 10 comprising the protective device 101. With the protective device 101, the supply energy may be safeguarded before being forwarded to the fieldbus modules 20, 22.

In a further embodiment of the protective device 100, 101, the input 102 and/or the output 104 are/is protected by polarity reversal protection. It is thus possible for the components of the protective device 100, 101 to be protected against incorrect connection of the energy supply device 7 and the electric currents arising as a result.

In a further embodiment of the protective device 100, 101 that is not illustrated, the input 102 and/or the output 104 comprise(s) a feedback protective device. The feedback protective device prevents an electric current from being able to flow from the output 104 to the input 102. Further electrical apparatuses that are electrically connected to the input 102 are thus protected. It is likewise possible for the feedback protective device to be implemented in the switch arrangement 105 and/or in the first and second power switches 110, 120 and/or the current measuring unit 150.

This invention has been described with respect to exemplary embodiments. It is understood that changes can be made and equivalents can be substituted to adapt these disclosures to different materials and situations, while remaining with the scope of the invention. The invention is thus not limited to the particular examples that are disclosed, but encompasses all the embodiments that fall within the scope of the claims.

What is claimed is:

1. A protective device comprising:
a switch arrangement including an input, an output, a first power switch, a second power switch and a drive unit,
wherein the first and second power switches are electrically connected in parallel with one another between the input and the output,
wherein the drive unit is connected to the first and second power switches to control the first and second power switches,
wherein the first power switch is configured to conduct a first forward current in a conducting state of the first power switch, to limit said first forward current in a current-limiting state of the first power switch, and to interrupt said first forward current in an interrupting state of the first power switch,
wherein the second power switch is configured to conduct a second forward current in a conducting state of the second power switch, to limit said second forward current in a current-limiting state of the second power switch, and to interrupt said second forward current in an interrupting state of the second power switch,
wherein the second power switch comprises a lower on resistance than the first power switch,
wherein the first power switch is configured, in the current-limiting state of the first power switch, to take up more power loss than the second power switch in the current-limiting state of the second power switch, and
wherein in a current-limiting state of the switch arrangement the drive unit is configured, for the purpose of limiting the current flowing between the input and the output, to control the first and second power switches such that the second power switch is in the interrupting state of the second power switch and such that the first power switch is in the current-limiting state of the first power switch.

2. The protective device according to claim 1, wherein the drive unit is configured, for the purpose of limiting the current flowing between the input and the output, firstly to transfer the second power switch from the conducting state of the second power switch to the interrupting state of the second power switch and only afterward to transfer the first power switch from the conducting state of the first power switch to the current-limiting state of the first power switch.

3. The protective device according to claim 1, wherein the first power switch and/or the second power switch are/is configured as a semiconductor switch, in particular as a transistor, in particular as a FET, in particular as a MOSFET, in particular as an n-channel MOSFET.

4. The protective device according to claim 1, wherein the first power switch comprises a first control connection and the second power switch comprises a second control connection, wherein the first forward current is controllable by a control signal applicable to the first control connection of the first power switch, wherein the second forward current is controllable by a control signal applicable to the second control connection of the second power switch, wherein the first and second control connection, for the purpose of having a common control signal applied to them, are connected to a control output of the drive unit, wherein the first power switch is configured to limit the first forward current in the current-limiting state of the first power switch if a common limiting signal is present as the common control signal at the first control connection of the first power switch, and
wherein the second power switch is configured to interrupt the second forward current in the interrupting state of the second power switch if the common limiting signal is present at the second control connection of the second power switch.

5. The protective device according to claim 4,
wherein the first and second power switches are configured to the effect that the control signal is applied as a control voltage to the first control connection of the first power switch and to the second control connection of the second power switch,
wherein the first power switch is configured to interrupt the first forward current in the interrupting state of the first power switch if the control voltage present at the first control connection of the first power switch falls below a first threshold voltage,
wherein the second power switch is configured to interrupt the second forward current in the interrupting state of the second power switch if the control voltage present at the second control connection of the second power switch falls below a second threshold voltage,
wherein the second threshold voltage of the second power switch is greater than the first threshold voltage of the first power switch, and
wherein the control voltage as the common limiting signal comprises a voltage value lying between the first and second threshold voltages.

6. The protective device according to claim 1, wherein the drive unit is configured to limit the current flowing between the input and the output of the protective device on the basis of an intensity of the current flow through the switch arrangement and/or on the basis of a voltage dropped across the switch arrangement in such a way that the first power switch is operated in a safe operating area of the first power switch.

7. The protective device according to claim 1, wherein the drive unit is configured to end the limiting of the current flowing between the input and the output of the protective device by the drive unit firstly transferring the first power switch from the current-limiting state of the first power switch to the conducting state of the first power switch and only afterward transferring the second power switch from the interrupting state of the second power switch to the conducting state of the second power switch.

8. The protective device to claim 1,
wherein the first power switch is configured to interrupt the first forward current in the interrupting state of the first power switch,
wherein the drive unit is configured to limit the current flowing between the input and the output of the protective device to a predefined maximum current by the first power switch that is in the current-limiting state of the first power switch and the second power switch that is in the interrupting state of the second power switch,
wherein the drive unit is configured to monitor a duration of the limiting of the current flowing between the input and the output of the protective device to the predefined maximum current, and
wherein the drive unit is configured to interrupt the current flowing between the input and the output of the protective device by the first power switch that is in the interrupting state of the first power switch and the second power switch that is in the interrupting state of the second power switch after the current flowing between the input and the output of the protective device has been limited to the predefined maximum current for a predefined duration.

9. A fieldbus module comprising an interface unit for linking to a fieldbus, comprising:
an input for feeding with a supply energy, comprising an output for forwarding the supply energy to a further fieldbus module, and comprising a protective device,
wherein the protective device comprises a switch arrangement connected between the input and the output in order to limit the current of the supply energy flowing between the input and the output,
wherein the switch arrangement comprises a first power switch, a second power switch and a drive unit connected to the first and second power switches for controlling the power switches, wherein the first and second power switches are electrically connected in parallel with one another between the input and the output, as a result of which a first part of the current flowing between the input and the output may flow as a first forward current through the first power switch and a second part of the current flowing between the input and the output may flow as a second forward current through the second power switch,
wherein the first power switch is configured to conduct the first forward current in a conducting state of the first power switch, to limit the first forward current in a current-limiting state of the first power switch and to interrupt said first forward current in an interrupting state of the first power switch,
wherein the second power switch is configured to conduct the second forward current in a conducting state of the second power switch, to limit the second current in a current-limiting state of the second power switch and to interrupt the second forward current in an interrupting state of the second power switch,
wherein the fieldbus module comprises a module housing comprising a side face,
wherein the side face of the module housing of the fieldbus module is arrangeable directly adjacent to a further side face of a module housing of the further fieldbus module, and
wherein the output is arranged in an exposed fashion at the side face of the module housing in such a way that the output is electrically contactable by a supply input of the further fieldbus module, said supply input being arranged at the further side face of the further fieldbus module, by the further side face being arranged directly adjacent to the side face of the fieldbus module.

10. The fieldbus module according to claim 9,
wherein the second power switch in the conducting state of the second power switch comprises a lower on resistance than the first power switch in the conducting state of the first power switch, and
wherein the first power switch is configured, in the current-limiting state of the first power switch, to take up more power loss than the second power switch in the current-limiting state of the second power switch.

11. The fieldbus module according to claim 9, wherein the interface unit and the drive unit are connected to one another in order to transmit information relating to the limiting of the current of the supply energy via the fieldbus.

12. The fieldbus module according to claim 9,
wherein the first power switch is configured to interrupt the first forward current in the interrupting state of the first power switch,
wherein the drive unit is configured to limit the current flowing between the input and the output to a predefined maximum current by the first power switch that is in the current-limiting state of the first power switch and the second power switch that is in the interrupting state of the second power switch,
wherein the drive unit is configured to monitor a duration of the limiting of the current flowing between the input and the output to the predefined maximum current, and
wherein the drive unit is configured to interrupt the current flowing via the output to the further field bus module by the first power switch that is in the interrupting state of the first power switch and the second power switch that is in the interrupting state of the second power switch after the current flowing between the input and the output has been limited to the predefined maximum current for a predefined duration.

13. A protective device comprising:
a first power switch, a second power switch and a drive unit,
wherein the first power switch comprises a first control connection and the second power switch comprises a second control connection,
wherein the first and second power switches are configured to the effect that the control signal is applied as a control voltage to the first control connection of the first power switch and to the second control connection of the second power switch,
wherein a first forward current is controllable by a control signal applicable to the first control connection of the first power switch,
wherein a second forward current is controllable by a control signal applicable to the second control connection of the second power switch,
wherein the first and second control connection, for the purpose of having a common control signal applied to them, are connected to a control output of the drive unit,
wherein the first power switch is configured to limit the first forward current in a current-limiting state of the first power switch if a common limiting signal is present as the common control signal at the first control connection of the first power switch,
wherein the second power switch is configured to interrupt the second forward current in an interrupting state of the second power switch if the common limiting signal is present at the second control connection of the second power switch, wherein the first power switch is configured to interrupt the first forward current in an interrupting state of the first power switch if the control voltage present at the first control connection of the first power switch falls below a first threshold voltage, wherein the second power switch is configured to interrupt the second forward current in the interrupting state of the second power switch if the control voltage present at the second control connection of the second power switch falls below a second threshold voltage, wherein the second threshold voltage of the second power switch is greater than the first threshold voltage of the first power switch, and wherein the control voltage as the common limiting signal comprises a voltage value lying between the first and second threshold voltages.

14. The protective device according to claim 13, wherein the drive unit is configured to limit the current flowing between the input and the output of the protective device on the basis of an intensity of the current flow through a switch arrangement and/or on the basis of a voltage dropped across the switch arrangement in such a way that the first power switch is operated in a safe operating area of the first power switch.

15. The protective device according to claim 13, wherein the drive unit is configured to end the limiting of the current flowing between a input and an output of the protective device by the drive unit firstly transferring the first power switch from the current-limiting state of the first power switch to a conducting state of the first power switch and only afterward transferring the second power switch from the interrupting state of the second power switch to a conducting state of the second power switch.

16. The protective device according to claim 13, wherein the second power switch is configured to limit the second forward current in a current-limiting state of the second power switch, and wherein the first power switch is configured, in the current-limiting state of the first power switch, to take up more power loss than the second power switch in the current-limiting state of the second power switch.

* * * * *